(12) United States Patent
Cranford et al.

(10) Patent No.: US 10,804,919 B1
(45) Date of Patent: Oct. 13, 2020

(54) DYNAMIC SEQUENTIAL APPROXIMATION REGISTER (SAR) ANALOG-TO-DIGITAL CONVERTER (ADC) (SAR-ADC) CLOCK DELAY CALIBRATION SYSTEMS AND METHODS

(71) Applicant: Microsoft Technology Licensing, LLC, Redmond, WA (US)

(72) Inventors: Hayden Cranford, Cary, NC (US); Michael Raymond Trombley, Cary, NC (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/579,997

(22) Filed: Sep. 24, 2019

(51) Int. Cl.
  *H03M 1/10* (2006.01)
  *H03M 1/06* (2006.01)
(52) U.S. Cl.
  CPC ....... *H03M 1/1033* (2013.01); *H03M 1/0612* (2013.01)
(58) Field of Classification Search
  CPC .......................... H03M 1/1033; H03M 1/0612
  USPC .................................................. 341/120, 172
  See application file for complete search history.

(56) References Cited

U.S. PATENT DOCUMENTS

| | | |
|---|---|---|
| 7,315,269 B2 | 1/2008 | Schreier et al. |
| 8,193,957 B2 | 6/2012 | Yoshioka |
| 8,344,925 B1 * | 1/2013 | Evans ................... H03M 1/462 341/118 |
| 8,659,464 B2 | 2/2014 | Jeon et al. |
| 8,902,094 B1 | 12/2014 | Zhang et al. |
| 9,608,652 B2 | 3/2017 | Lee et al. |
| 9,685,973 B2 * | 6/2017 | Liu ...................... H03M 1/1245 |

(Continued)

FOREIGN PATENT DOCUMENTS

CN 103312329 A 9/2013

OTHER PUBLICATIONS

Frans, Yohan, et al., "A 56Gb/s PAM4 Wireline Transceiver using a 32-way Time-Interleaved SAR ADC in 16nm FinFET", In Proceedings of Symposium on VLSI Circuits Digest of Technical Papers, Apr. 2017, 2 Pages.

(Continued)

*Primary Examiner* — Khai M Nguyen
(74) *Attorney, Agent, or Firm* — Withrow & Terranova, PLLC

(57) ABSTRACT

A time-interleaved SAR-ADC employs calibrated SAR-ADC circuits to convert sampled voltage levels into serial digital data. Variable delay clock circuits synchronize clock signals received at the respective SAR-ADCs to sampling points of analog serial data. IC and environmental fluctuations cause delay in the variable delay clock circuits to skew the clock signals. A calibrated SAR-ADC detects changes to the delays in the variable delay clock circuits. By delaying a first clock signal in the variable delay clock circuit, and comparing a phase of the delayed clock signal to a phase-shifted clock signal having a known phase shift relative to the first clock signal, a change in the delay of the variable delay clock circuit can be detected as a phase difference. Based on an indication of a phase difference, a delay control signal is generated to control the delay in the variable delay clock.

22 Claims, 8 Drawing Sheets

(56) References Cited

U.S. PATENT DOCUMENTS 9,985,640 B1 * 5/2018 Wen .................. H03M 1/1009
2017/0194980 A1 7/2017 Hernes

OTHER PUBLICATIONS

Razavi, Behzad, "Design Considerations for Interleaved ADCs", In Journal of IEEE Solid-State Circuits, vol. 48, Issue 8, Aug. 2013, pp. 1806-1817.

* cited by examiner

DYNAMIC SEQUENTIAL APPROXIMATION REGISTER (SAR) ANALOG-TO-DIGITAL CONVERTER (ADC) (SAR-ADC) CLOCK DELAY CALIBRATION SYSTEMS AND METHODS

FIELD OF THE DISCLOSURE

The technology of the disclosure relates to analog-to-digital converter (ADC) circuits and, more particularly, to receiving analog data on a high speed serial interface and converting the serial data to digital/binary values with a sequential approximation register (SAR) ADC (SAR-ADC).

BACKGROUND

The speeds at which processors in integrated circuits (ICs) process binary data continues to increase. The binary data to be processed must be provided to the processor at a sufficiently high rate to avoid the processor waiting for data. Video processors are one example of a type of processor to which large amounts of binary data are transferred at a high rate, but other types of processors have similar capability. Data communication interfaces transmit and receive binary data in an IC periodically at a high frequency. Data can be transmitted or received in every cycle of a reference clock, which may be derived from the periodically changing data. Large data buses can be used to transfer large amounts of data, one or more binary bits at a time, simultaneously in parallel in every clock cycle. However, each piece of data transferred over a data bus to a processor or other IC corresponds to a physical electrical conductor (e.g., wire) connected to a package containing the IC. Each wire connects to a physical pin/connector that occupies space on the package. As IC devices become smaller, the area available for pins/connectors is reduced. To avoid the need for a large number of pins/connectors, IC designers may alternatively use serial binary interfaces. A serial interface allows a single piece of data to be transmitted in each clock cycle using a very high frequency clock.

Transmitted and received data may be represented on a wire as an electrical signal, such as a voltage level. If the voltage level is changed periodically, in every cycle of a clock, the new voltage level can be detected each clock cycle and converted into a binary form of the data represented by the voltage. Thus, an analog signal in the form of a voltage level is converted into binary data, which is the formed needed for processing in an IC, by an analog-to-digital converter (ADC). One type of ADC that consumes relatively little power compared to other ADCs is a sequential approximation register (SAR) (SAR-ADC). However, the process of converting an analog voltage into binary data in a SAR-ADC may take longer than a single period of the high speed clock used by the serial interface. This problem is addressed by employing multiple SAR-ADCs that are interleaved in time, as explained with reference to the example in FIG. 1A.

In the example in FIG. 1A, the voltage level of the analog data signal $V_{IN}$ is sampled once per cycle. The frequency of the analog data signal $V_{IN}$ corresponds to the frequency of the clock CLOCK shown in FIG. 1A. In this example, at the frequency of clock CLOCK, SAR-ADC 1, which may be a SAR-ADC as shown in FIG. 1B, requires five (5) clock cycles to convert a sampled voltage into a binary value. At this conversion rate, after sampling a first voltage level of $V_{IN}$ at the beginning of cycle 1 of the clock CLOCK, the SAR-ADC 1 isn't available to sample another voltage level until the beginning of cycle 6 of the clock CLOCK when $V_{OUT}$1 is generated, based on the data sampled in cycle 1. Therefore, SAR-ADC 2 is used to sample a voltage level of $V_{IN}$ in cycle 2 and then again in cycle 7 when $V_{OUT}$2 is generated. SAR-ADC 3 samples a voltage level of $V_{IN}$ in cycle 3 and again in cycle 8 when $V_{OUT}$3 is generated. SAR-ADC 4 samples a voltage level of $V_{IN}$ in cycle 4 and again in cycle 9 when $V_{OUT}$4 is generated. SAR-ADC 5 samples a voltage level of $V_{IN}$ in cycle 5 and again cycle 10 when $V_{OUT}$5 is generated. Each of SAR-ADC 1-SAR-ADC 5 samples data every fifth cycle (e.g., in a continuous rotation) and generates a corresponding digital value (e.g., $V_{OUT}$1-$V_{OUT}$9 in FIG. 1A). In this regard, the time-interleaved SAR-ADC 1-SAR-ADC 5 perform analog-to-digital data conversion at a rate that is five times faster than the conversion rate possible in an individual SAR-ADC. Such interleaving requires each of the individual SAR-ADCs to receive a respective clock signal synchronized to the sampling point of a cycle of $V_{IN}$. For this purpose, synchronized clock signals for clocking each of the SAR-ADCs in a corresponding cycle, are provided on the IC. However, physical placement of the respective SAR-ADCs in different locations on the IC causes the respective clock signals to have different propagation delays to the respective SAR-ADCs, such that the respective clock signals received at the SAR-ADCs are no longer synchronized.

SUMMARY

Exemplary aspects disclosed herein include dynamic sequential approximation register (SAR) analog-to-digital converter (ADC) (SAR-ADC) clock calibration systems and methods. A time-interleaved SAR-ADC on an IC employs individual SAR-ADCs to sample, in a time-interleaved manner, voltage levels of an analog signal at respective sampling points in sequential data cycles. The time-interleaved SAR-ADC converts the sampled voltage levels into serial digital data. A voltage level of the time-varying analog signal sampled outside of a sampling point in a data clock cycle may not accurately represent the transmitted data. Therefore, each of the individual SAR-ADCs must each be synchronized to a respective sampling point in a data clock cycle. To achieve synchronization, a clock source provides clock signals, synchronized with the sampling point(s) of the sequential data cycles, to each of the individual SAR-ADCs at respective clock inputs. Clock traces (e.g., wires) transmit the clock signals over the IC from the clock inputs to the respective individual SAR-ADCs distributed over the IC. The clock traces lengths vary according to the respective SAR-ADC positions, causing each clock signal to have a unique propagation delay, so the clock signals received at the SAR-ADCs are no longer synchronized.

In a calibration process, clock calibration circuits employed by the SAR-ADCs include variable delay clock circuits to further delay each clock signal by a selected amount to resynchronize the clock signals received at the respective SAR-ADCs to sampling points of sequential data clock cycles. Propagation delays through the clock traces remain nearly constant in the presence of IC and environmental fluctuations (e.g., voltage and/or temperature), but the selected amount of delay in each of the variable delay clock circuits can change, causing the resynchronized signals to be skewed with respect to the sampling points of sequential data clock cycles. The calibration process does not dynamically address skew in the clock signals that is caused by changes in the variable delays due to IC and environmental fluctuations.

In this regard, in exemplary aspects disclosed herein, a calibrated SAR-ADC detects changes to the delays in the variable delay clock circuits. By delaying a first clock signal in the variable delay clock circuit, and comparing a phase of the delayed clock signal to a phase-shifted clock signal having a known phase shift relative to the first clock signal, a change in the delay of the variable delay clock circuit can be detected as an indication of a phase difference. Based on the phase difference, a delay control signal is generated to control the phase difference by controlling the delay in the variable delay clock.

In this regard, in exemplary aspects disclosed herein, a calibrated SAR-ADC circuit includes a clock calibration circuit, a SAR-ADC circuit, and a delay control circuit. The clock calibration circuit includes a clock input configured to receive a first clock signal having a first phase and a frequency, and a variable delay clock circuit configured to generate a plurality of delayed clock signals each delayed by a respective delay with respect to the first clock signal based on a delay adjust signal. The SAR-ADC circuit is configured to sample a voltage level of an analog data signal in response to a calibrated delayed clock signal of the plurality of delayed clock signals, and generate a digital value corresponding to a sampled voltage level of an analog data signal. The delay control circuit comprises a phase-difference detection circuit and a delay adjust circuit. The phase-difference detection circuit is configured to receive a monitored delayed clock signal of the plurality of delayed clock signals delayed by a selected delay with respect to the first clock signal, receive a phase-shifted clock signal having the frequency of the first clock signal and a second phase different than the first phase of the first clock signal, and generate an indication of a phase difference between a phase of the monitored delayed clock signal and the second phase of the phase-shifted clock signal. The delay adjust circuit is configured to generate the delay adjust signal based on the indication of the phase difference from the phase-difference detection circuit.

In another embodiment, a method in a calibrated SAR-ADC circuit is disclosed. The method includes, in a clock calibration circuit, receiving a first clock signal having a frequency and a first phase, and generating a plurality of delayed clock signals each delayed by a respective delay with respect to the first clock signal based on a delay adjust signal. The method further includes, in a SAR-ADC circuit, sampling a voltage level on an analog data signal in response to a calibrated delayed clock signal of the plurality of delayed clock signals, and generating a digital value corresponding to the sampled voltage level. The method still further includes, in a delay control circuit, receiving a monitored delayed clock signal of the plurality of delayed clock signals delayed by a selected delay with respect to the first clock signal, receiving a phase-shifted clock signal having the frequency of the first clock signal and a second phase different than the first phase of the first clock signal, generating an indication of a phase difference between a phase of the monitored delayed clock signal and the second phase of the phase-shifted clock signal, and generating the delay adjust signal based on the indication of the phase difference.

In another embodiment, a time-interleaved SAR-ADC system is disclosed. The time-interleaved SAR-ADC system includes a plurality of clock inputs configured to receive a plurality of first clock signals each having a frequency and a respective phase, a plurality of calibrated SAR-ADC circuits, and a delay control circuit. The plurality of calibrated SAR-ADC circuits each includes a clock calibration circuit, configured to generate a plurality of delayed clock signals each delayed with respect to the first one of the plurality of first clock signals based on a delay adjust signal. Each of the calibrated SAR-ADC circuits also includes a SAR-ADC circuit configured to sample a voltage level of an analog data signal in response to a calibrated delayed clock signal among the plurality of delayed clock signals, and generate a digital value corresponding to the sampled voltage level of the analog data signal. The delay control circuit includes a phase-difference detection circuit, configured to receive a monitored delayed clock signal among the plurality of delayed clock signals from one of the plurality of calibrated SAR-ADC circuits, receive a phase-shifted clock signal having a same frequency and a different phase than a first clock signal received in the one of the plurality of calibrated SAR-ADC circuits, and generate an indication of a phase difference between a phase of the monitored delayed clock signal and the second phase of the phase-shifted clock signal. The delay control circuit also includes a delay control modification circuit configured generate a delay control signal based on the indication of the phase difference from the phase-difference detection circuit and a delay adjust circuit configured to generate a first delay adjust signal based on the delay control signal. In the time-interleaved SAR-ADC system, the first delay adjust signal is the delay adjust signal in the clock calibration circuit in at least one of the plurality of calibrated SAR-ADC circuits.

In another embodiment, a method in a time-interleaved SAR-ADC system is disclosed. The method includes, in each of a plurality of calibrated SAR-ADC circuits, receiving one of a plurality of first clock signals each having a frequency and a respective first phase, generating, in a clock calibration circuit, a plurality of delayed clock signals each delayed with respect to the one of the plurality of first clock signals based on a delay adjust signal, sampling, in a SAR-ADC circuit, a voltage level of an analog data signal in response to a calibrated delayed clock signal among the plurality of delayed clock signals, and generating, in the SAR-ADC circuit, a digital value corresponding to the sampled voltage level of the analog data signal. The method further includes, in a delay control circuit, receiving a monitored delayed clock signal among the plurality of delayed clock signals from one of the plurality of calibrated SAR-ADC circuits, receiving a phase-shifted clock signal having a same frequency and a second phase different than the respective first phase of the one of the plurality of first clock signals received in the one of the plurality of calibrated SAR-ADC circuits, generating, in a phase difference detection circuit, an indication of a phase difference between a phase of the monitored delayed clock signal and the second phase of the phase-shifted clock signal, generating, in a delay control modification circuit, a delay control signal based on the indication of the phase difference, and generating a first delay adjust signal based on the delay control signal. In the method of the time-interleaved SAR-ADC system, the first delay adjust signal is the delay adjust signal in at least one of the plurality of calibrated SAR-ADC circuits.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
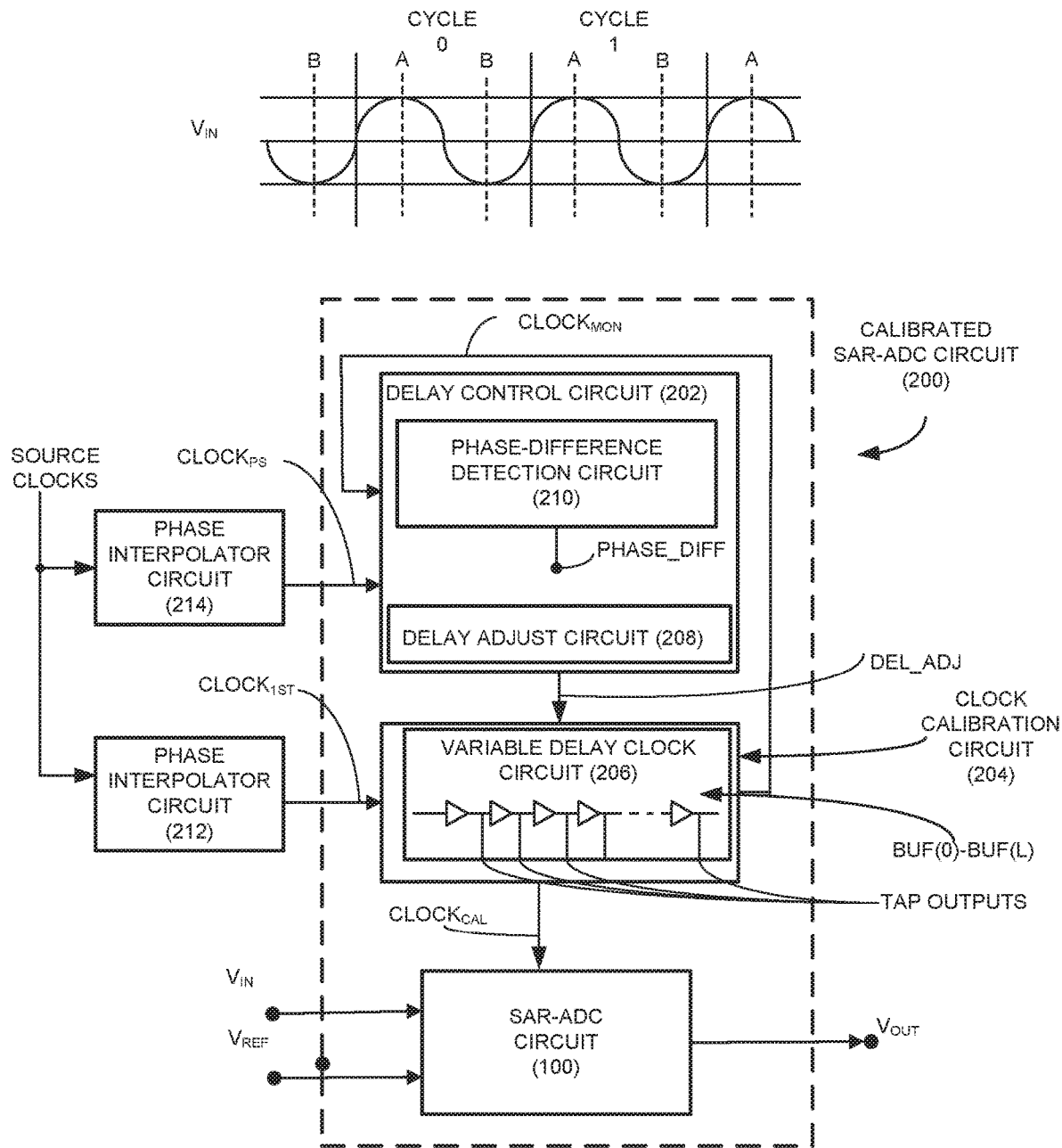
Figure 3:
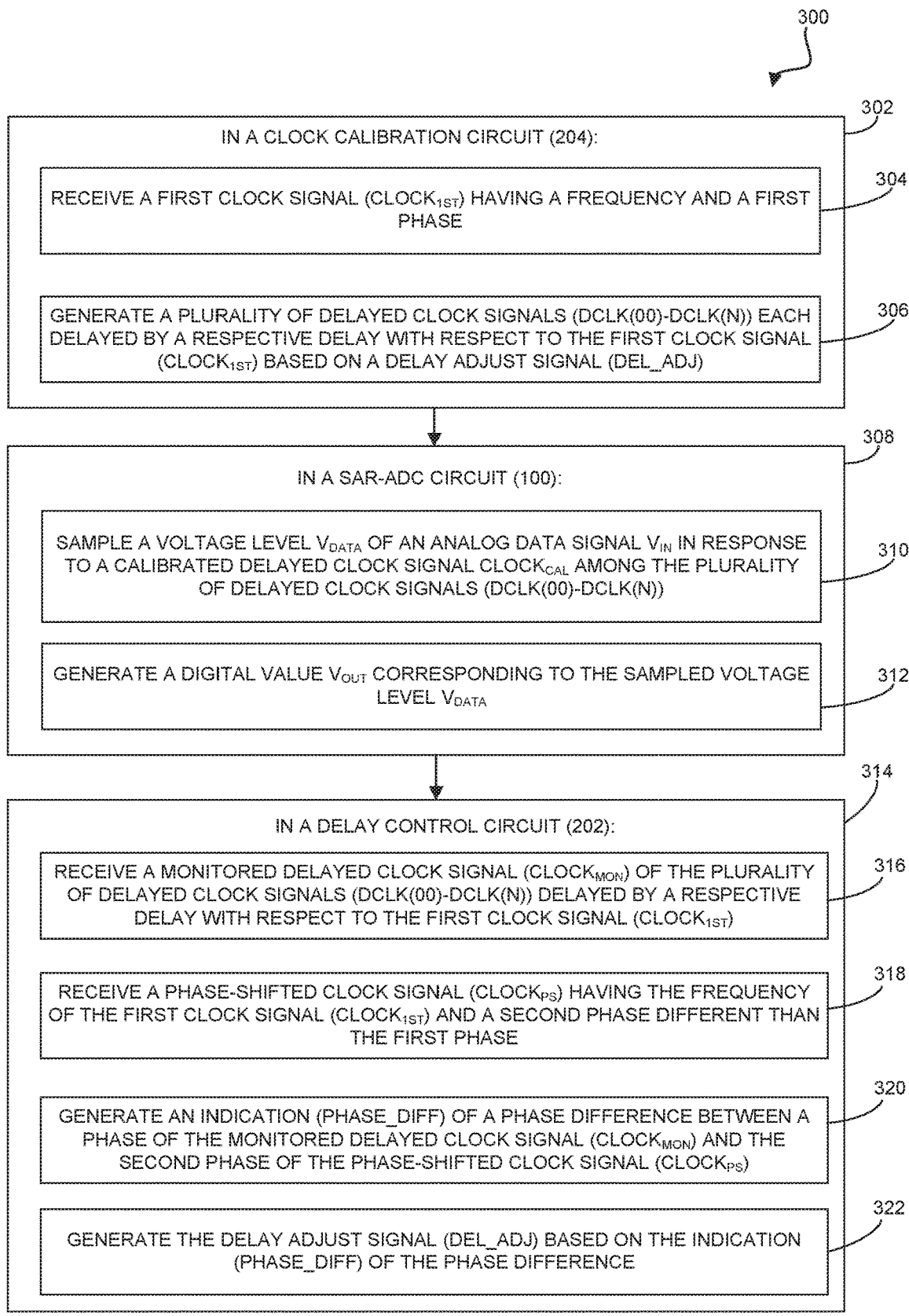
Figure 4:
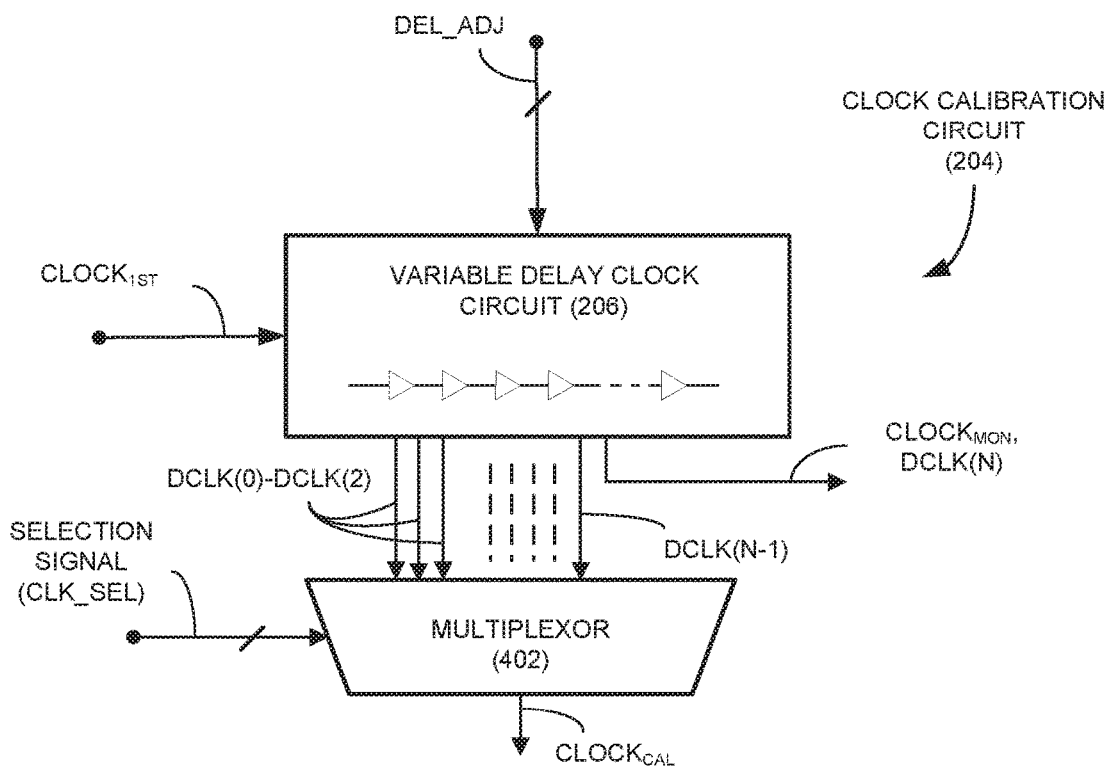
Figure 4:
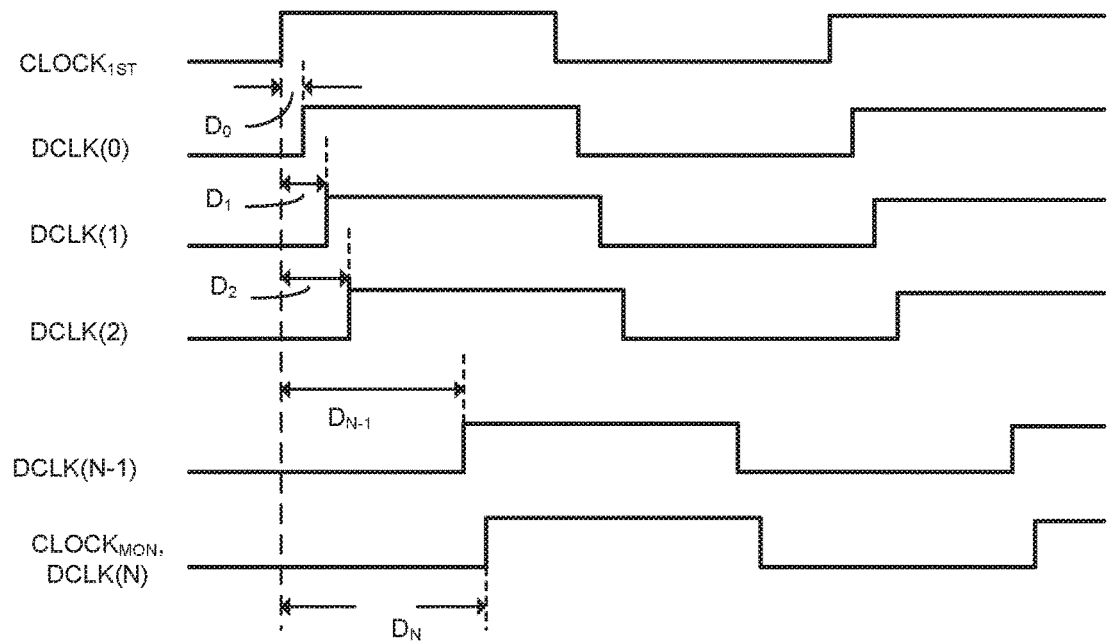
Figure 5:
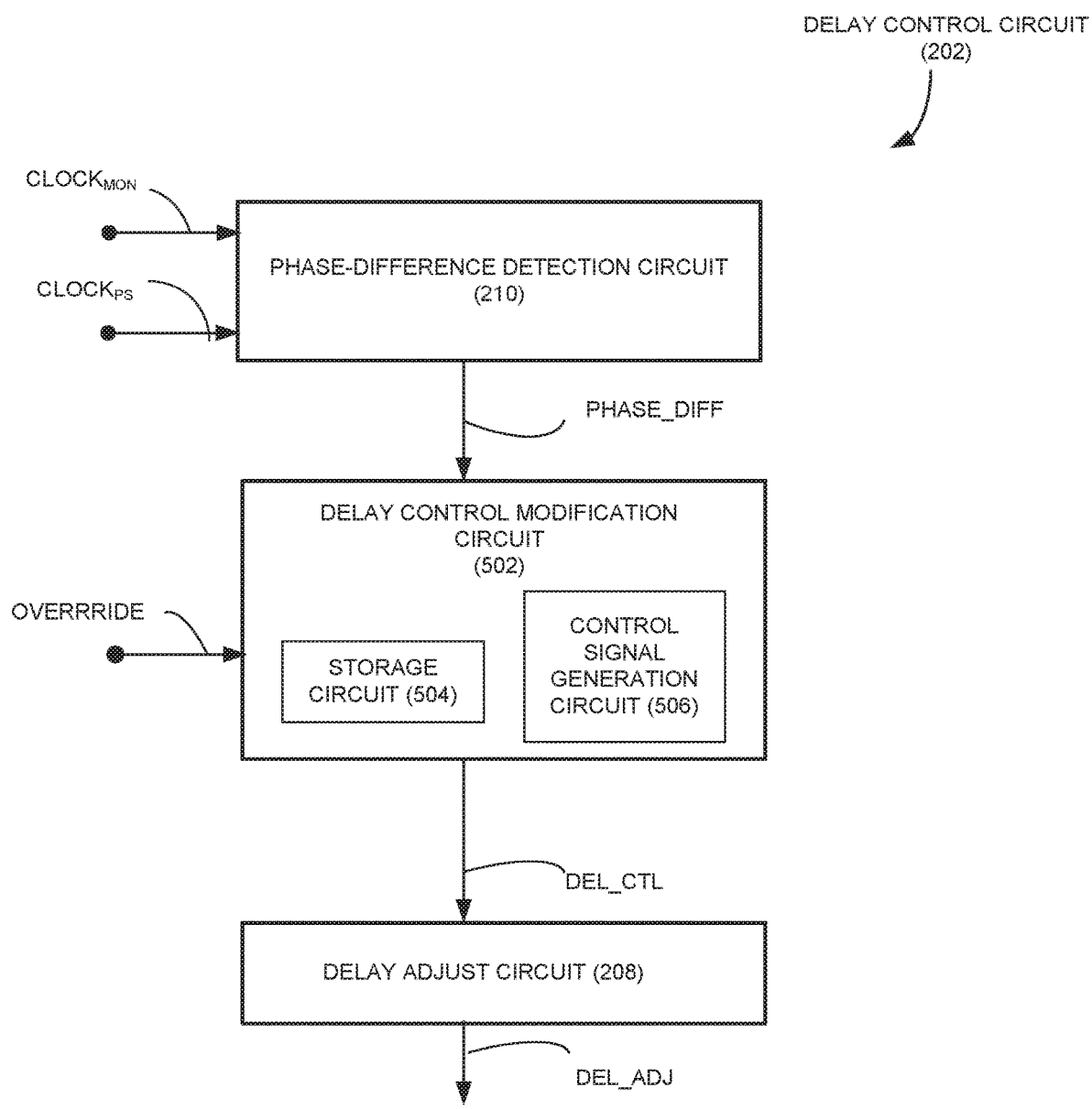
Figure 6:
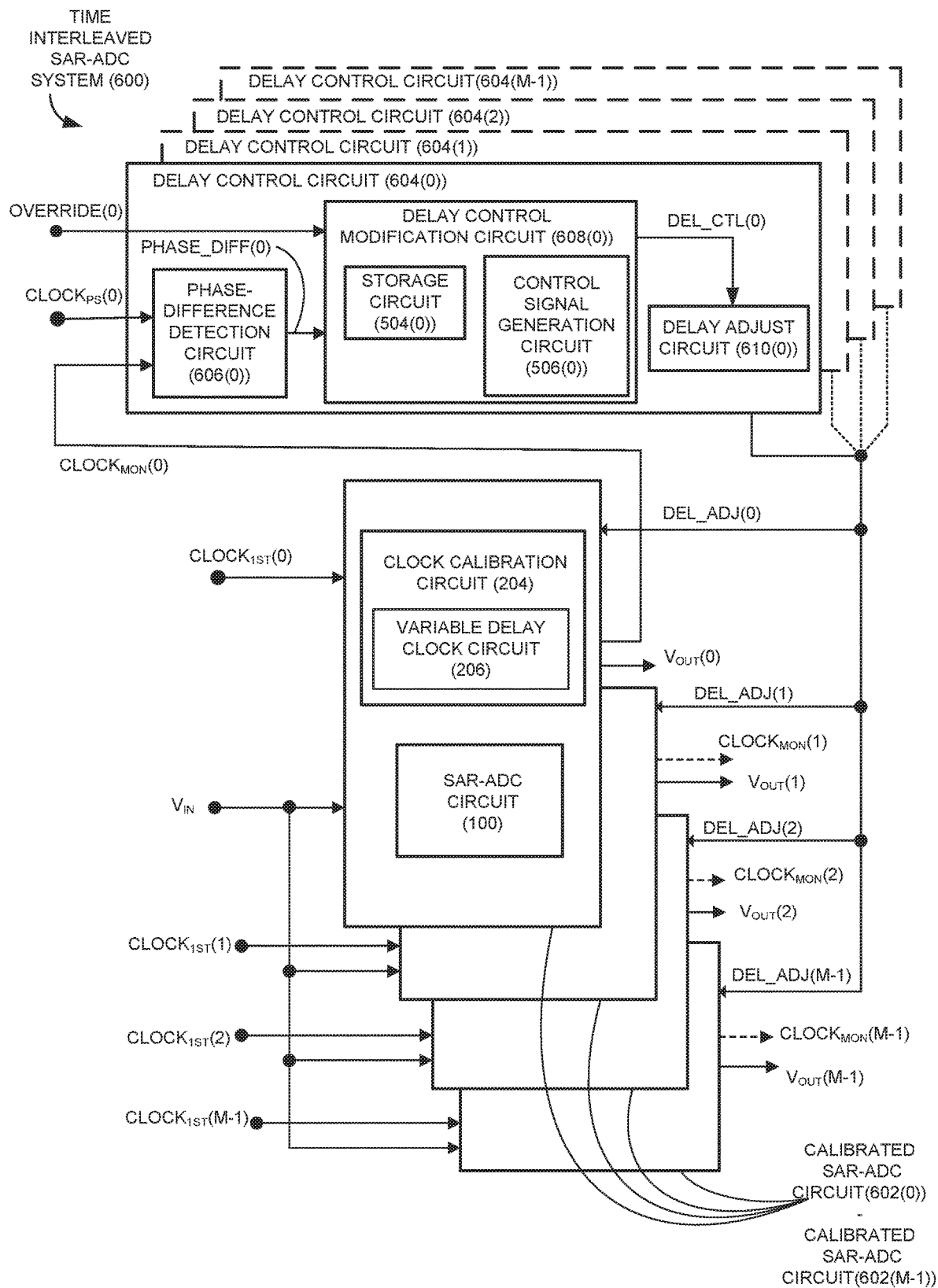
Figure 7:
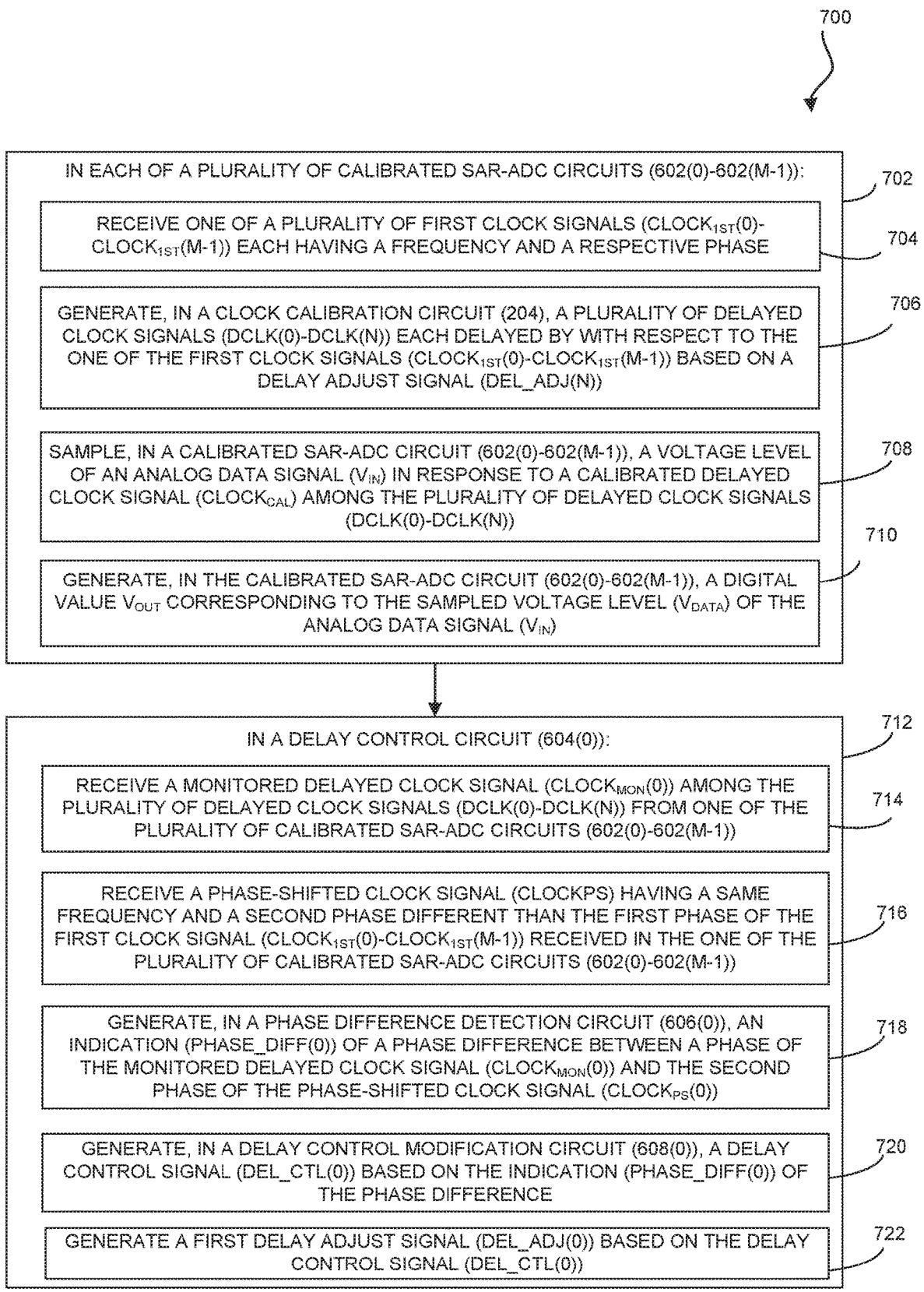
Figure 8:
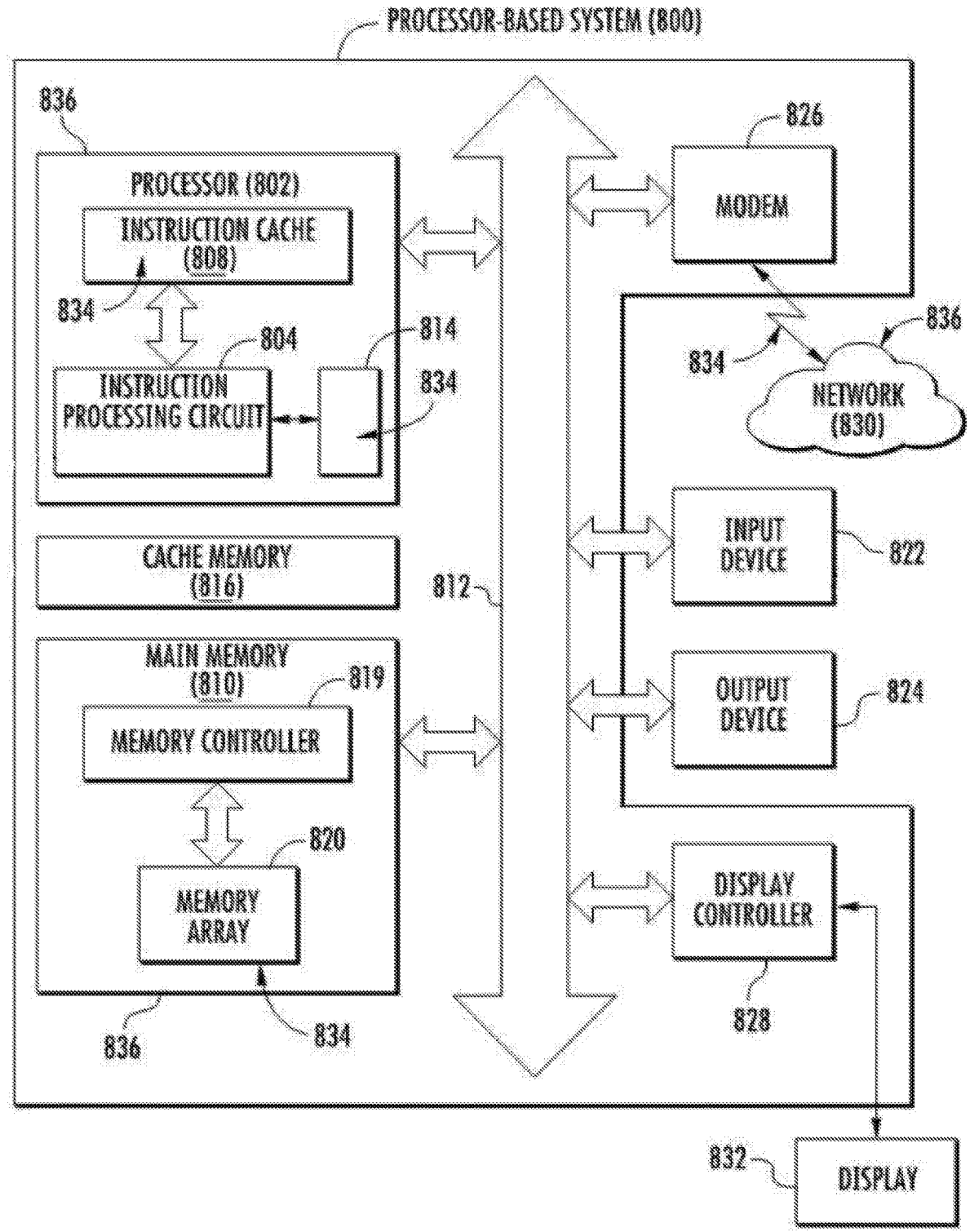

FIG. 2 is a schematic diagram of an exemplary calibrated SAR-ADC circuit configured to maintain a consistent selected amount of clock delay by comparing a phase of a clock signal delayed by a variable delay clock circuit to a phase of a phase-shifted clock signal and generating a delay control signal to control the clock delay based on a detected phase difference, and a timing diagram of an analog data signal sampled by the calibrated SAR-ADC circuit;

FIG. 3 is a flowchart of a method of controlling clock delay in the calibrated SAR-ADC circuit of FIG. 2;

FIG. 4 is a schematic diagram of a clock calibration circuit including a variable delay clock circuit in the calibrated SAR-ADC circuit in FIG. 2, and a timing diagram of delayed clock signals delayed by respective amounts with respect to a first clock signal;

FIG. 5 is a schematic diagram of a delay control circuit configured to generate a delay control signal to control a delay adjust circuit in the calibrated SAR-ADC circuit of FIG. 2 to control clock delay through the variable delay clock circuit;

FIG. 6 is an illustration of a time-interleaved SAR-ADC system including a plurality of individual calibrated SAR-ADC circuits of FIG. 2 and configured to sample consecutive voltage levels of an analog data signal and generate digital values to convert serial analog data into serial digital data;

FIG. 7 illustrates a method of a SAR-ADC system employing time-interleaved calibrated SAR-ADC circuits to convert voltage levels in consecutive cycles of an analog data signal to serial digital data; and FIG. 8 is a block diagram of an exemplary processor-based system including a processor configured to receive serial data in analog form over a serial data interface and employing the time-interleaved SAR-ADC system of FIG. 6, comprising the calibrated SAR-ADC circuit of FIG. 2 to convert the analog serial data into a series of digital data for use by the processor.

DETAILED DESCRIPTION

Exemplary aspects disclosed herein include dynamic sequential approximation register (SAR) analog-to-digital converter (ADC) (SAR-ADC) clock calibration systems and methods. A time-interleaved SAR-ADC on an IC employs individual SAR-ADCs to sample, in a time-interleaved manner, voltage levels of an analog signal at respective sampling points in sequential data cycles. The time-interleaved SAR-ADC converts the sampled voltage levels into serial digital data. A voltage level of the time-varying analog signal sampled outside of a sampling point in a data clock cycle may not accurately represent the transmitted data. Therefore, each of the individual SAR-ADCs must each be synchronized to a respective sampling point in a data clock cycle. To achieve synchronization, a clock source provides clock signals, synchronized with the sampling point(s) of the sequential data cycles, to each of the individual SAR-ADCs at respective clock inputs. Clock traces (e.g., wires) transmit the clock signals over the IC from the clock inputs to the respective individual SAR-ADCs distributed over the IC. The clock traces lengths vary according to the respective SAR-ADC positions, causing each clock signal to have a unique propagation delay, so the clock signals received at the SAR-ADCs are no longer synchronized.

In a calibration process, clock calibration circuits employed by the SAR-ADCs include variable delay clock circuits to further delay each clock signal by a selected amount to resynchronize the clock signals received at the respective SAR-ADCs to sampling points of sequential data clock cycles. Propagation delays through the clock traces remain nearly constant in the presence of IC and environmental fluctuations (e.g., voltage and/or temperature), but the selected amount of delay in each of the variable delay clock circuits can change, depending on such conditions, causing the resynchronized signals to be skewed with respect to the sampling points of sequential data clock cycles. The calibration process does not dynamically address skew in the clock signals caused by changes in the variable delays due to IC and environmental fluctuations.

In this regard, in exemplary aspects disclosed herein, a calibrated SAR-ADC detects changes to the delays in the variable delay clock circuits. By delaying a first clock signal in the variable delay clock circuit, and comparing a phase of the delayed clock signal to a phase-shifted clock signal having a known phase shift relative to the first clock signal, a change in the delay of the variable delay clock circuit can be detected as an indication of a phase difference. Based on the phase difference, a delay control signal is generated to control the phase difference by controlling the delay in the variable delay clock.

Figure 1A:
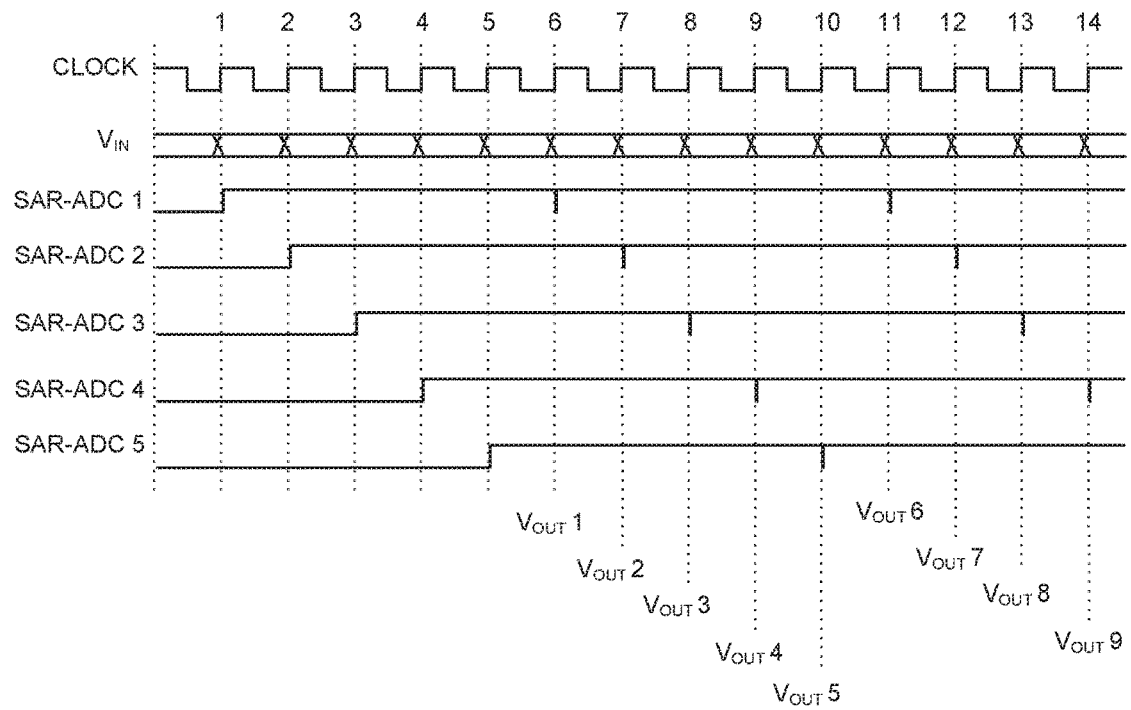
FIG. 1A is a timing diagram illustrating how sequential approximation register (SAR) analog-to-digital converters (ADC) (SAR-ADCs) are time-interleaved for sampling data at a higher frequency than is possible using a single SAR-ADC.

A SAR-ADC is a low-power circuit for converting a sampled voltage level to a digital value. However, depending on certain components of the SAR-ADC, there is at least a minimum amount of time necessary for performing the analog-to-digital conversion, and the period of a data clock cycle in a high-speed serial interface may be shorter than this minimum time. In such situations, a time-interleaved SAR-ADC can employ individual SAR-ADCs that sample data in consecutive data clock cycles. For example, in the example in FIG. 1A, the analog-to-digital conversion time is five (5) times the period of a data clock cycle of a serial interface, so five SAR-ADCs are used in a time-interleaved manner such that each of the SAR-ADCs samples the voltage level of the analog signal every fifth data clock cycle (e.g., in continuous rotation). Operation of a SAR-ADC is described with reference to the schematic diagram of a SAR-ADC 100 illustrated in FIG. 1B.

A SAR-ADC is a low-power circuit for converting a sampled voltage level to a digital value. However, depending on certain components of the SAR-ADC, there is at least a minimum amount of time necessary for performing the analog-to-digital conversion, and the period of a data clock cycle in a high-speed serial interface may be shorter than this minimum time. In such situations, a time-interleaved SAR-ADC can employ individual SAR-ADCs that sample data in consecutive data clock cycles. For example, in the example in FIG. 1A, the analog-to-digital conversion time is five (5) times the period of a data clock cycle of a serial interface, so five SAR-ADCs are used in a time-interleaved manner such that each of the SAR-ADCs samples the voltage level of the input analog data signal every fifth data clock cycle (e.g., in continuous rotation). Operation of a SAR-ADC is described with reference to the schematic diagram of a SAR-ADC circuit 100 illustrated in FIG. 1B.

Figure 1B:
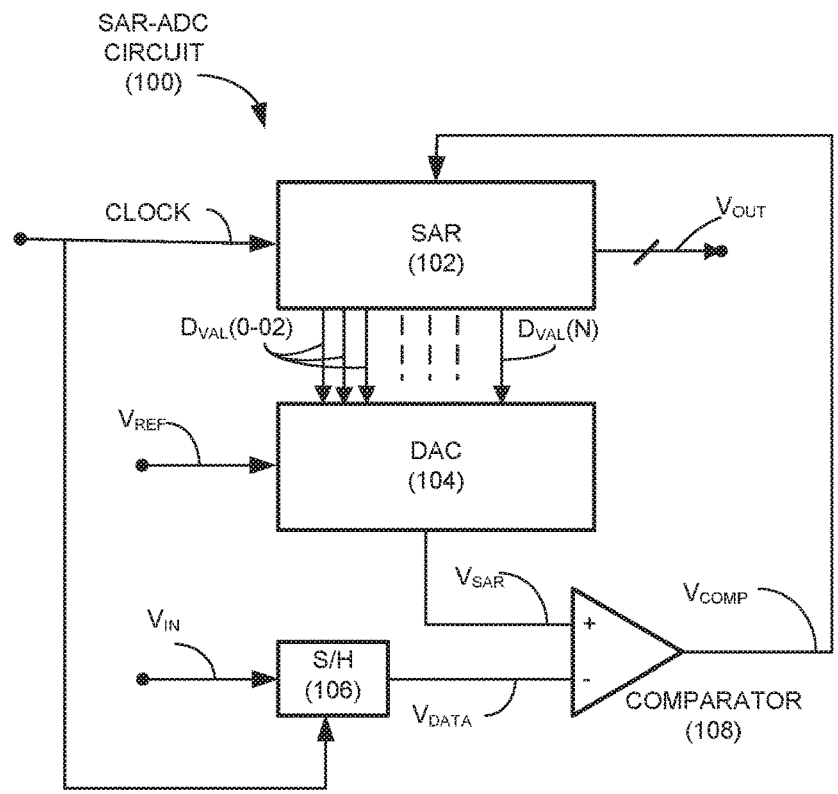
FIG. 1B is a schematic diagram of a SAR-ADC circuit configured to sample a voltage level of an analog data signal and convert the sampled voltage level to digital data.

The SAR-ADC circuit 100 in FIG. 1B includes a SAR 102, a digital-to-analog converter (DAC) 104, a sample and hold (S/H) circuit 106, and a comparator 108. The SAR 102 generates a digital value $D_{VAL}(0)$-$D_{VAL}(N)$ based on a voltage level ($V_{DATA}$) sampled from an analog data signal $V_{IN}$. Initially, the SAR 102 generates the digital value $D_{VAL}(0)$-$D_{VAL}(N)$ to correspond to a voltage level in the middle of an expected range, with the range having a maximum value indicated by a reference voltage $V_{REF}$. Here, the most significant bit (MSB) of the $D_{VAL}(0)$-$D_{VAL}(N)$ is set to a binary "1" while the remaining bits are set to "0". The DAC 104 converts the digital value $D_{VAL}(0)$-$D_{VAL}(N)$ into a voltage level $V_{SAR}$, which is initially half of the reference voltage $V_{REF}$. The comparator 108 compares the voltage level $V_{SAR}$ to the voltage level $V_{DATA}$ sampled and stored by the S/H circuit 106. The S/H circuit 106 samples $V_{DATA}$ by briefly closing a switch coupled to an analog data input on which the analog data signal $V_{IN}$ is received. The switch is controlled by a clock signal CLOCK.

An output $V_{COMP}$ of the comparator 108 indicates whether the voltage level of $V_{DATA}$ is higher or lower than the voltage level of $V_{SAR}$, which corresponds to $D_{VAL}(0)$-$D_{VAL}(N)$ with the MSB set. If the voltage level of $V_{DATA}$ is higher than the voltage level of $V_{SAR}$, the MSB of $D_{VAL}(0)$-$D_{VAL}(N)$ is reset (i.e., to "0"). If the voltage level of $V_{DATA}$ is lower than the voltage level of $V_{SAR}$, the MSB of $D_{VAL}(0)$-$D_{VAL}(N)$ remains set (i.e., to "1"). In either case, the SAR 102 proceeds to a next step in which the next MSB is set in the $D_{VAL}(0)$-$D_{VAL}(N)$, and the resulting $V_{SAR}$ is compared to the $V_{DATA}$ stored in the S/H circuit 106. If the voltage level of $V_{DATA}$ is higher than the voltage level of $V_{SAR}$, the next MSB of $D_{VAL}(0)$-$D_{VAL}(N)$ is reset (i.e., to "0"). If the voltage level of $V_{DATA}$ is lower than the voltage level of $V_{SAR}$, the next MSB of $D_{VAL}(0)$-$D_{VAL}(N)$ remains set (i.e., to "1"). This process is repeated for each bit of $D_{VAL}(0)$-$D_{VAL}(N)$ until all of the N+1 bits are either set or reset. When the process is complete, the digital value indicated by $D_{VAL}(0)$-$D_{VAL}(N)$ corresponds to the sampled voltage level $V_{DATA}$, and this digital value is generated on $V_{OUT}$.

As discussed above, the propagation delay of a clock trace providing a clock signal to a SAR-ADC may cause the clock to be unsynchronized with the sampling point of the analog data signal $V_{IN}$. Thus, the clock signal to the SAR-ADC is calibrated to the clock trace propagation delay by employing a variable delay clock circuit to resynchronize the clock signal to the SAR-ADC. However, the delays in a variable delay clock circuit vary under IC and environmental conditions.

A calibrated SAR-ADC circuit 200 is illustrated in FIG. 2 and is configured to control a selected amount of clock delay through a variable delay clock circuit. In this regard, variation of the selected amount of clock delay may be minimized. The calibrated SAR-ADC circuit 200 includes a delay control circuit 202, a clock calibration circuit 204, and a SAR-ADC circuit 100. Although the description herein is directed to the calibrated SAR-ADC circuit 200 employing the SAR-ADC circuit 100 in FIG. 1B, the calibrated SAR-ADC circuit 200 is not limited in this regard and could be implemented with other embodiments of a SAR-ADC (not shown). As discussed above, the SAR-ADC circuit 100 samples the analog data signal $V_{IN}$ when a switch in the S/H circuit 106 is temporarily closed. In FIG. 2, a calibrated delayed clock signal $CLOCK_{CAL}$, generated by the clock calibration circuit 204, is provided to the SAR-ADC circuit 100. The calibrated delayed clock signal $CLOCK_{CAL}$ is synchronized to the sampling point of a data clock cycle of the analog data signal $V_{IN}$ and is used in the SAR-ADC circuit 100 to control the switch (not shown).

The clock calibration circuit 204 includes a clock input configured to receive a first clock signal $CLOCK_{1ST}$ having a first phase and a frequency corresponding to the analog data signal $V_{IN}$. The clock calibration circuit 204 further includes a variable delay clock circuit 206. The clock input receives the first clock signal $CLOCK_{1ST}$ from a clock source via a clock trace. Although the first clock signal $CLOCK_{1ST}$ may be synchronized to the analog data signal $V_{IN}$ at the clock source, the first clock signal $CLOCK_{1ST}$ received at the SAR-ADC circuit 100 may not be synchronized with the analog data signal $V_{IN}$ due to the propagation delay of the clock trace. The variable delay clock circuit 206 is configured to generate a plurality of delayed clock signals each delayed by a respective delay with respect to the first clock signal $CLOCK_{1ST}$. From among the plurality of delayed clock signals, a delayed clock signal mostly closely synchronized to a sampling point of the analog data signal $V_{IN}$ is selected as the calibrated delayed clock signal $CLOCK_{CAL}$ and provided to the SAR-ADC circuit 100. The calibrated delayed clock signal $CLOCK_{CAL}$ may be synchronized with a sampling point of the analog data signal $V_{IN}$ by, for example, delaying a rising edge of the first clock signal $CLOCK_{1ST}$ to correspond to a sampling point in a next cycle of the analog data signal $V_{IN}$.

Controlling delay in the variable delay clock circuit 206 is necessary to avoid skew (i.e., a shift in time) of the calibrated delayed clock signal $CLOCK_{CAL}$ away from the sampling point of the analog data signal $V_{IN}$. This necessity is explained with reference to an illustrated example of two cycles of the analog data signal $V_{IN}$ (CYCLE 0 and CYCLE 1) in FIG. 2. As shown in the illustration, the amplitude of the voltage of the analog data signal $V_{IN}$ varies in time during each of CYCLE 0 and CYCLE 1. The sampling points A and B in each cycle indicate times within each cycle that the analog data signal $V_{IN}$ is expected to have a voltage level corresponding to a transmitted data value. In other embodiments, there may be more or less sampling points in each data clock cycle. In various embodiments, the voltage level at each sampling point may indicate a single bit of data or multiple bits of data. Due to the varying nature of the analog data signal $V_{IN}$, a voltage level sampled either earlier than or later than the sampling points A and B may be higher or lower than the expected data value. Therefore, avoiding skew in the calibrated delayed clock signal $CLOCK_{CAL}$, which is synchronized to one of the sampling points A and B, ensures that a sampled voltage level corresponds to the expected transmitted data value.

In some embodiments, the variable delay clock circuit 206 is formed of a series of buffers BUF(0)-BUF(L), wherein each buffer BUF(0)-BUF(L) incrementally delays the first clock signal $CLOCK_{1ST}$, and the outputs of the buffers BUF(0)-BUF(L) provide tap points at which respective delayed clock signals are generated. The output of a buffer BUF(0)-BUF(L) synchronized to or most closely synchronized to the data clock cycle of the analog data signal $V_{IN}$ is selected as the calibrated delayed clock signal $CLOCK_{CAL}$, which is coupled to the SAR-ADC circuit 100. Other embodiments of the variable delay clock circuit 206 providing a plurality of tap points having respectively delayed clock signals may be employed and are within the scope of the present disclosure.

IC conditions and environmental conditions (e.g., voltage and/or temperature variations), to which the variable delay clock circuit 206 is subject during operation, can change the speed of operation of circuits, causing the delay amount of a selected delayed clock signal to increase or decrease. For example, a delay amount in each of the series of buffers BUF(0)-BUF(L) may increase. Although such increase may be relatively minor at the output of a first buffer BUF(0) to which the first clock signal $CLOCK_{1ST}$ is provided, the increase is doubled, tripled, etc. as the signal propagates through subsequent buffers BUF(1)-BUF(L). As a result, the calibrated delayed clock signal $CLOCK_{CAL}$ provided to the SAR-ADC circuit 100 may become significantly skewed, and no longer synchronized with the analog data signal $V_{IN}$.

To reduce clock skew in the variable delay clock circuit 206, the delay control circuit 202 includes a delay adjust circuit 208 and a phase-difference detection circuit 210. The delay adjust circuit 208 provides a delay adjust signal DEL_ADJ to the variable delay clock circuit 206 to compensate for delay changes caused by IC and/or environmental conditions. For example, in the embodiment in which the variable delay clock circuit 206 includes a series of buffers BUF(0)-BUF(L), an increase or decrease of delay caused by conditions within the IC can be offset by decreasing or increasing a voltage and/or current level provided to the buffers BUF(0)-BUF(L) to restore each buffer to a desired delay.

The delay adjust circuit 208 is configured to generate the delay adjust signal DEL_ADJ in response to determining that an amount of clock delay of a monitored delayed clock signal $CLOCK_{MON}$, which is one of the plurality of delayed clock signals generated by the variable delay clock circuit 206, has changed. Such determination is based on a comparison of a phase of the monitored delayed clock signal $CLOCK_{MON}$ and a phase-shifted clock signal $CLOCK_{PS}$, which is shifted in phase by a known amount with respect to the first clock signal $CLOCK_{1ST}$. The known amount of phase shift (e.g., in degrees) corresponds to a portion of a period of a clock cycle of the analog data signal $V_{IN}$. The first clock signal $CLOCK_{1ST}$ having a first phase may be generated by a phase interpolator circuit 212, and the phase-shifted clock signal $CLOCK_{PS}$ having a second phase may be generated by a phase interpolator circuit 214. Each of the phase interpolator circuits 212 and 214 receive SOURCE CLOCKS, which may comprise a plurality of root clocks from a phase-locked loop (PLL). If an amount of time the first clock signal $CLOCK_{1ST}$ is delayed to generate the monitored delayed clock signal $CLOCK_{MON}$ corresponds to the known phase shift, there will be no phase difference between the phase of the monitored delayed clock signal $CLOCK_{MON}$ and the second phase of the phase-shifted clock signal $CLOCK_{PS}$. Thus, the phase shift of the phase-shifted clock signal $CLOCK_{PS}$ with respect to the first clock signal $CLOCK_{1ST}$ is selected to correspond to the delay of the monitored delayed clock signal $CLOCK_{MON}$. In some embodiments, the monitored delayed clock signal $CLOCK_{MON}$ is generated by the last of the series of buffers (e.g. buffer BUF(L)) in the variable delay clock circuit 206.

To compare the phase of the monitored delayed clock signal $CLOCK_{MON}$ and the phase-shifted clock signal $CLOCK_{PS}$, the delay control circuit 202 includes the phase-difference detection circuit 210. The phase-difference detection circuit 210 is configured to receive the monitored delayed clock signal $CLOCK_{MON}$ of the plurality of delayed clock signals delayed by a selected delay with respect to the first clock signal $CLOCK_{1ST}$, receive the phase-shifted clock signal $CLOCK_{PS}$ having the frequency of the first clock signal $CLOCK_{1ST}$ and a second phase different than the first phase of the first clock signal $CLOCK_{1ST}$, and generate an indication PHASE_DIFF of the phase difference between the phase of the monitored delayed clock signal $CLOCK_{MON}$ and the second phase of the phase-shifted clock signal $CLOCK_{PS}$. If no indication PHASE_DIFF of a phase difference between the phase of the monitored delayed clock signal $CLOCK_{MON}$ and the second phase of the phase-shifted clock signal $CLOCK_{PS}$ is detected, the delay control circuit 202 determines that delay through the variable delay clock circuit 206 is as is desired and generates the delay control signal DEL_ADJ accordingly (e.g., keeping DEL_ADJ constant) to keep the delay constant. In response to an indication PHASE_DIFF of a phase difference between the phase of the monitored delayed clock signal $CLOCK_{MON}$ and the second phase of the phase-shifted clock signal $CLOCK_{PS}$, the delay control circuit 202 generates the delay adjust signal DEL_ADJ (e.g., increases or decreases) to compensate for or offset the indication of a detected phase difference. When a delay in the variable delay clock circuit 206 has slowed down, the phase of the monitored delayed clock signal $CLOCK_{MON}$ lags the second phase of the phase-shifted clock signal $CLOCK_{PS}$. In a case when the delay in the variable delay clock circuit 206 speeds up, the phase of the monitored delayed clock signal $CLOCK_{MON}$ leads the second phase of the phase-shifted clock signal $CLOCK_{PS}$. Based on the indication PHASE_DIFF of the phase difference from the phase-difference detection circuit 210, the delay adjust circuit 208 generates the delay adjust signal DEL_ADJ to align the phases of the monitored delayed clock signal $CLOCK_{MON}$ and the phase-shifted clock signal $CLOCK_{PS}$.

The SAR-ADC circuit 100 in FIG. 2 is configured to sample a voltage level of an analog data signal $V_{IN}$ in response to the calibrated delayed clock signal $CLOCK_{CAL}$ of the plurality of delayed clock signals DCLK(0)-DCLK(N), and generate a digital value $V_{OUT}$ corresponding to the voltage level $V_{DATA}$ sampled on the analog data signal $V_{IN}$.

FIG. 3 is a flowchart illustrating a method 300 of controlling a clock delay in the calibrated SAR-ADC circuit 200 of FIG. 2. The method 300 includes, in the clock calibration circuit 204 (block 302), receiving a first clock signal $CLOCK_{1ST}$ having a frequency and a first phase (block 304). The method 300 continues in the clock calibration circuit 204 with generating a plurality of delayed clock signals DCLK(0)-DCLK(N) each delayed by a respective delay with respect to the first clock signal $CLOCK_{1ST}$ based on a delay adjust signal DEL_ADJ (block 306). The method 300 continues, in the SAR-ADC circuit 100 (block 308), with sampling a voltage level $V_{DATA}$ of an analog data signal $V_{IN}$ in response to a calibrated delayed clock signal $CLOCK_{CAL}$, among the plurality of delayed clock signals DCLK(0)-DCLK(N) (block 310). The method 300 continues in the SAR-ADC circuit 100 with generating a digital value $V_{OUT}$ corresponding to the sampled voltage level $V_{DATA}$ (block 312). The method 300 further continues, in the delay control circuit 202 (block 314), with receiving a monitored delayed clock signal $CLOCK_{MON}$ of the plurality of delayed clock signals DCLK(0)-DCLK(N) delayed by a respective delay with respect to the first clock signal $CLOCK_{1ST}$ (block 316). The method 300 further includes receiving, in the delay control circuit 202, the phase-shifted clock signal $CLOCK_p$ having the frequency of the first clock signal $CLOCK_{1ST}$ and a second phase different than the first phase of the first clock signal $CLOCK_{1ST}$ (block 318). The method 300 in the delay control circuit 202 further includes generating an indication PHASE_DIFF of a phase difference between a phase of the monitored delayed clock signal ($CLOCK_{MON}$) and the second phase of the phase-shifted clock signal ($CLOCK_{PS}$) (block 320). In the delay control circuit 202, the method 300 continues with generating the delay adjust signal DEL_ADJ based on the indication PHASE_DIFF of the phase difference between the phase of the monitored delayed clock signal (CLOCK$_{MON}$) and the second phase of the phase-shifted clock signal (CLOCK$_{PS}$) (block 322).

FIG. 4 is schematic diagram of the clock calibration circuit 204 including the variable delay clock circuit 206 in the calibrated SAR-ADC circuit 200 of FIG. 2. FIG. 4 also includes a timing diagram of the plurality of delayed clock signals DCLK(0)-DCLK(N) delayed by respective amounts with respect to the first clock signal CLOCK$_{1ST}$. As discussed above, in some embodiments, the plurality of delayed clock signals DCLK(0)-DCLK(N) is generated in the variable delay clock circuit 206 by serially coupled delay buffers BUF(0)-BUF(L) configured to delay the first clock signal CLOCK$_{1ST}$, and the variable delay clock circuit 206 includes a plurality of tap outputs coupled to outputs of the respective delay buffers BUF(0)-BUF(L). The monitored delayed clock signal CLOCK$_{MON}$ may be DCLK(N), generated by the last buffer BUF(L) of the serially connected clock buffers, thereby having a longer delay with respect to the first clock signal CLOCK$_{1ST}$ than any of the other delayed clock signals DCLK(0)-DCLK(N−1). However, the monitored delayed clock signal CLOCK$_{MON}$ is not necessarily delayed longer than all the other delayed clock signals of the plurality of delayed clock signals DCLK(0)-DCLK(N−1).

As shown in FIG. 4, the delayed clock signals DCLK(0), DCLK(01), DCLK(02), DCLK(N−1), and DCLK(N) are delayed with respect to the first clock signal CLOCK$_{1ST}$ by delays D$_0$, D$_1$, D$_2$, D$_{N-1}$, and D$_N$, respectively. A selectable plurality of the delayed clock signals DCLK(0)-DCK(N) from tap outputs of the variable delay clock circuit 206 is provided to inputs of a multiplexor 402 in the clock calibration circuit 204. The multiplexor 402 is coupled to the tap outputs of the variable delay clock circuit 206 and configured to receive the selectable plurality of the plurality of delayed clock signals DCLK(0)-DCK(N). The multiplexor 402 is configured to select, based on a selection signal CLK_SEL, one of the selectable plurality of delayed clock signals DCLK(0)-DCK(N), and generate the calibrated delayed clock signal CLOCK$_c$ based on the selected one of the selectable plurality of delayed clock signals DCLK(0)-DCK(N). In a calibration process, the multiplexor selection signal CLK_SEL is controlled to select one of the plurality of delayed clock signals DCLK(0)-DCLK(N) synchronized with, or most closely synchronized with, a sampling point of the analog data signal V$_{IN}$, and the selected one is provided to the SAR-ADC circuit 100 as the calibrated delayed clock signal CLOCK$_{CAL}$.

FIG. 5 is a schematic diagram of the delay control circuit 202 in the calibrated SAR-ADC circuit 200 of FIG. 2 configured to generate the delay adjust signal DEL_ADJ to control a clock delay through the variable delay clock circuit 206. FIG. 5 shows the phase-difference detection circuit 210 configured to detect the phase difference between the phase of the monitored delayed clock signal CLOCK$_{MON}$ and the second phase of the phase-shifted clock signal CLOCK$_{PS}$. The phase-difference detection circuit 210 is further configured to generate the indication PHASE_DIFF of the phase difference between the phase of the monitored delayed clock signal CLOCK$_{MON}$ and the second phase of the phase-shifted clock signal CLOCK$_{PS}$. The indication PHASE_DIFF of the phase difference is provided to a delay control modification circuit 502 in the delay control circuit 202. The delay control modification circuit 502 is configured to receive the indication PHASE_DIFF of the phase difference between the phase of the monitored delayed clock signal CLOCK$_{MON}$ and the second phase of the phase-shifted clock signal CLOCK$_{PS}$, and generate a delay control signal DEL_CTL to control the delay adjust circuit 208 to generate the delay adjust signal DEL_ADJ. The delay adjust signal DEL_ADJ controls the respective delays by which the plurality of delayed clock signals DCLK(0)-DCLK(N) is delayed with respect to the first clock signal CLOCK$_{1ST}$.

In other words, the delay control circuit 202 is configured to generate the delay adjust signal DEL_ADJ to control the phase difference between the phase of the monitored delayed clock signal CLOCK$_{MON}$ and the second phase of the phase-shifted clock signal CLOCK$_{PS}$. In some embodiments, the delay control circuit 202 is configured to generate the delay adjust signal DEL_ADJ to offset a change to the phase difference to minimize the phase difference between the phase of the monitored delayed clock signal CLOCK$_{MON}$ and the second phase of the phase-shifted clock signal CLOCK$_{PS}$. In some embodiments, a target phase difference may be a phase difference of zero degrees between the phase of the monitored delayed clock signal CLOCK$_{MON}$ and the second phase of the phase-shifted clock signal CLOCK$_{PS}$. The target phase difference may correspond to the monitored delayed clock signal CLOCK$_{MON}$ having a known delay with respect to the first clock signal CLOCK$_{1ST}$. In some embodiments, the delay control circuit 202 is configured to, in response to the indication PHASE_DIFF of the phase difference indicating that the phase of the monitored delayed clock signal CLOCK$_{MON}$ leads the second phase of the phase-shifted clock signal CLOCK$_{PS}$, adjust the delay adjust signal DEL_ADJ to increase a delay of the monitored delayed clock signal CLOCK$_{MON}$ with respect to the phase-shifted clock signal CLOCK$_{PS}$. The delay control circuit 202 is also configured to, in response to the indication PHASE_DIFF of the phase difference indicating that the phase of the monitored delayed clock signal CLOCK$_{MON}$ lags the second phase of the phase-shifted clock signal CLOCK$_{PS}$ adjust the delay adjust signal DEL_ADJ to decrease the delay of the monitored delayed clock signal CLOCK$_{MON}$ with respect to the phase-shifted clock signal CLOCK$_{PS}$.

FIG. 5 includes a timing diagram illustrating instances in which the monitored delayed clock signal CLOCK$_{MON}$ has a difference in phase with the phase-shifted clock signal CLOCK$_{PS}$. In a first instance, an early monitored delayed clock signal CLOCK$_{MON\_EARLY}$ has a rising edge occurring earlier than a rising edge of the phase-shifted clock CLOCK$_{PS}$ by the phase difference D$_{EARLY}$ when the delays through the variable delay clock circuit 206 are shorter than expected. In a second instance, a late monitored delayed clock signal CLOCK$_{MON\_LATE}$ has a rising edge occurring later than a rising edge of the phase-shifted clock CLOCK$_{PS}$ by the phase difference D$_{LATE}$ when the delays through the variable delay clock circuit 206 are longer than expected.

The delay control modification circuit 502 in FIG. 5 is further configured to receive the indication PHASE_DIFF of the phase difference from the phase-difference detection circuit 210, and generate the delay control signal DEL_CTL to control the delay adjust circuit 208 to set the phase difference between the monitored delayed clock signal CLOCK$_{MON}$ and the phase-shifted clock signal CLOCK$_{PS}$ based on an OVERRIDE signal. The delay control modification circuit 502 includes an override input configured to receive the OVERRIDE signal. The delay control modification circuit 502 includes a storage circuit 504 configured to store a value of the OVERRIDE signal. The delay control modification circuit 502 may include a control signal generation circuit 506 configured to generate the OVERRIDE signal based on at least one of an OVERRIDE signal received on the override input, a stored value of the OVERRIDE signal stored in the storage circuit 504, and the indication PHASE_DIFF of the phase difference from the phase-difference detection circuit 210. For example, the OVERRIDE signal may be used to add an offset or multiplier to calibrate the delay control signal DEL_CTL. Alternatively, the OVERRIDE signal may be used to determine the delay control signal DEL_CTL in certain situations. For example, a value from a previous calibration process may be stored in the storage circuit 504 or provided via the OVERRIDE signal to set a value of the delay control signal DEL_CTL to reduce a time from reset to a fully calibrated state. In another example, delay settings may be determined based on measurements of harmonic distortion using spectrum analysis. In another example, the OVERRIDE signal or storage circuit 504 may provide a correction for an incorrectly implemented algorithm used in the calibration after reset. In another example, for analog data signals having four (4) different signal levels, a measure of the 4-Level Pulse Amplitude Modulation (PAM4) eye height may be used as an indicator to adjust delay settings for maximum signal levels. In another example, an algorithm may be implemented to produce a performance improvement by adjusting delay settings via the OVERRIDE signal. In another example, in a power-up sequence of the IC, the OVERRIDE signal may be used to set the delay control signal DEL_CTL, such as before the indication PHASE_DIFF of the phase difference can be sent by the phase-difference detection circuit 210.

FIG. 6 is an illustration of a time-interleaved SAR-ADC system 600 including a plurality of calibrated SAR-ADC circuits 602(0)-602(M−1) configured to sample consecutive voltage levels of the analog data signal $V_{IN}$ and generate digital values $V_{OUT}(0)$-$V_{OUT}(M-1)$ to convert serial analog data into serial digital data. Where the time-interleaved SAR-ADC system 600 comprises M of a particular component therein, such components may be referred to as (0)-(M−1) in the aggregate, or just (N) regarding an individual one of such component. The time-interleaved SAR-ADC system 600 includes a plurality of clock inputs configured to receive a plurality of first clock signals $CLOCK_{1ST}(0)$-$CLOCK_{1ST}(M-1)$, each having the same frequency and a respective phase synchronized to one of the consecutive sampling points of the analog data signal $V_{IN}$. The calibrated SAR-ADC circuits 602(0)-602(M−1) shown in FIG. 6 differ from the calibrated SAR-ADC circuits 200 in FIG. 2 because they do not each include the delay control circuit 202. Instead, each of the plurality of calibrated SAR-ADC circuits 602(0)-602(M−1) in the time-interleaved SAR-ADC system 600 includes only the clock calibration circuit 204, and the SAR-ADC circuit 100. The clock calibration circuit 204 in each of the calibrated SAR-ADC circuits 602(0)-602(M−1) is configured to generate a plurality of delayed clock signals each delayed with respect to a first clock signal $CLOCK_{1ST}(N)$ based on a delay adjust signal DEL_ADJ(N). The delay adjust signals DEL_ADJ(0)-DEL_ADJ(M−1) are, in a first embodiment, all generated in a delay control circuit 604(0) based on the delay control signal DEL_CTL(0). In an alternative embodiment of the time-interleaved SAR-ADC system 600 (discussed further below), each of the delay adjust signals DEL_ADJ(1)-DEL_ADJ(M−1) is generated in a corresponding delay control circuit 604(N). The SAR-ADC circuit 100 in each of the calibrated SAR-ADC circuits 602(0)-602(M−1) is configured to sample a voltage level of an analog data signal in response to a calibrated delayed clock signal among the plurality of delayed clock signals, and generate a digital value corresponding to the sampled voltage level of the analog data signal, as described above with regard to the SAR-ADC circuit 100 in FIG. 2.

The time-interleaved SAR-ADC system 600 also includes the delay control circuit 604(0). The delay control circuit 604(0) includes a phase-difference detection circuit 606(0) configured to receive the monitored delayed clock signal $CLOCK_{MON}(0)$ from the calibrated SAR-ADC circuit 602(0), receive the phase-shifted clock signal $CLOCK_{PS}(0)$ having the same frequency and a second phase different than the phase of the first clock signal $CLOCK_{1ST}(0)$, which is also received in the calibrated SAR-ADC circuit 602(0), and generate an indication PHASE_DIFF(0) of a phase difference between the phase of the monitored delayed clock signal $CLOCK_{MON}(0)$ and the second phase of the phase-shifted clock signal $CLOCK_{PS}(0)$. The delay control circuit 604(0) also includes a delay control modification circuit 608(0) configured to generate a delay control signal DEL_CTL(0) based on the indication PHASE_DIFF(0) from the phase-difference detection circuit 606(0). The delay control circuit 604(0) also includes a delay adjust circuit 610(0) which is configured to, in the first embodiment, generate a first delay adjust signal DEL_ADJ(0) based on the delay control signal DEL_CTL(0). The first delay adjust signal DEL_ADJ(0) may be the delay adjust signals DEL_ADJ(0)-DEL_ADJ(M−1) provided to at least one or all of the plurality of calibrated SAR-ADC circuits 602(0)-602(M−1). The delay control circuit 604(0) is configured to generate the first delay control signal DEL_CTL(0) to control the phase difference between the phase of the monitored delayed clock signal $CLOCK_{MON}(0)$ and the second phase of the phase-shifted clock signal $CLOCK_{PS}(0)$ in the plurality of calibrated SAR-ADC circuits 602(0)-602(M−1).

The plurality of calibrated SAR-ADC circuits 602(0)-602(M−1) receives the plurality of first clock signals $CLOCK_{1ST}(0)$-$CLOCK_{1ST}(M-1)$, samples voltage levels of the analog data signal $V_{IN}$ at consecutive sampling points, and generates digital values $V_{OUT}(0)$-$V_{OUT}(M-1)$ corresponding to the sampled voltage levels to convert serial analog data transmitted in the analog data signal $V_{IN}$ into digital data in each cycle.

As in the timing diagram in FIG. 2, each data clock cycle of the analog data signal $V_{IN}$ includes sampling points A and B at which times a voltage level is sampled in this example. Each of the M calibrated SAR-ADC circuits 602(0)-602(M−1) in the time-interleaved SAR-ADC system 600 in FIG. 6 is able to convert a sampled voltage level $V_{DATA}$ into a digital value $V_{OUT}$ within M/2 data clock cycles of the analog data signal $V_{IN}$. Thus, the calibrated SAR-ADC circuits 602(0)-602(M−1) are employed in a time-interleaved manner (e.g., in a rotating sequence) to sample data at every sampling point (e.g., A and B) in every cycle of the analog data signal $V_{IN}$ and convert the analog data to digital data.

To accomplish such interleaving, the M first clock signals $CLOCK_{1ST}(0)$-$CLOCK_{1ST}(M-1)$ are provided to the time interleaved SAR-ADC system 600. The M first clock signals $CLOCK_{1ST}(0)$-$CLOCK_{1ST}(M-1)$ are respectively synchronized to sequential sampling points of the M/2 data clock cycles. Each of the calibrated SAR-ADC circuits 602(0)-602(M−1) receives a corresponding one of the first clock signals $CLOCK_{1ST}(0)$-$CLOCK_{1ST}(M-1)$ via a clock trace having a propagation delay dependent on a position of the calibrated SAR-ADC circuit 602(N) (where "N" is 0 to M−1) on the IC. Thus, in the clock calibration process described above, the clock calibration circuit 204 is employed in each calibrated SAR-ADC circuit 602(n) to select a calibrated delayed clock signal CLOCK$_{CAL}$(N) to synchronize sampling of the calibrated SAR-ADC circuit 602(N) to a sampling point of a data clock cycle of the M/2 data clock cycles.

As shown in FIG. 6, the delay control circuit 604(0) of the time-interleaved SAR-ADC system 600 may include a single delay control modification circuit 608(0) and phase-difference detection circuit 606(0) having the functions of the delay control modification circuit 502 and the phase-difference detection circuit 210 in FIG. 5, respectively. In this example, the calibrated SAR-ADC circuits 602(0)602(M−1) may receive their respective delay adjust signal DEL_ADJ(N) from the delay control circuit 604(0). The variable delay clock circuits 206 experiencing the same IC and environmental fluctuations would be similarly affected. Thus, the delayed phase of the monitored delayed clock signal CLOCK$_{MON}$(0) would correspond to the delayed phases of the monitored delayed clock signals in the calibrated SAR-ADC circuits 602(1)-602(M−1) (i.e., CLOCK$_{MON}$(1)-CLOCK$_{MON}$(M−1)). The monitored delayed clock signal CLOCK$_{MON}$(0) is provided to the phase-difference detection circuit 606(0) for comparison to the phase-shifted clock signal CLOCK$_{PS}$(0), and the delay adjust signal DEL_ADJ(0) based on an indication PHASE_DIFF(0) of a detected phase difference can be used to compensate for or otherwise control the delay of the variable delay clock circuit 206 in each of the calibrated SAR-ADC circuits 602(0)-602(M−1).

In the alternative embodiment discussed above, the time-interleaved SAR-ADC system 600 includes delay control circuits 608(0)-608(M−1) generating outputs for each of the respective calibrated SAR-ADC circuits 602(0)-602(M−1), providing individualized controls. For example, where the IC and environmental fluctuations differ across the IC, or the effect that such fluctuations have across the IC varies, such that the delays through the respective variable delay clock circuits are not similarly affected, the delay control circuits 604(0)-604(M−1) are capable of providing individual controls. In this example, the time-interleaved SAR-ADC system 600 includes phase-difference detection circuits 606(0)-606(M−1) to provide individual indications PHASE_DIFF(0)-PHASE_DIFF(M−1) of the M phase differences to the delay control circuits 604(0)-604(M−1). Thus, the calibrated SAR-ADC circuits 602(1)-602(M−1) generate outputs CLOCK$_{MON}$(1) through CLOCK$_{MON}$(M−1) to be used in conjunction with corresponding phase-shifted clocks (not shown) for detecting individual phase-shifts in the delay control circuits 604(1)-604(M−1).

In this regard, each delay control circuit 604(N) includes a phase-difference detection circuit 606(N), a delay control modification circuit 608(N), and a delay adjust circuit 610(N). A second phase-difference detection circuit 606(N) is configured to generate a second indication of a second phase difference between the phase of the monitored delayed clock signal CLOCK$_{MON}$ of another one of the plurality of calibrated SAR-ADC circuits, not among the at least one of the plurality of the calibrated SAR-ADC circuits 602(0)-602(M−1) receiving the first delay adjust signal DEL_ADJ(0), and the second phase of a second phase-shifted clock signal CLOCK$_{PS}$(N). The second phase-shifted clock signal CLOCK$_{PS}$(N) is shifted with respect to the first clock signal CLOCK$_{1st}$(N). The second delay control modification circuit 608(N) is configured to generate a second delay control signal DEL_CTL(N) based on the second indication of the second phase-difference from the phase-difference detection circuit to control the second phase difference in the another one of the plurality of calibrated SAR-ADC circuits 602(N). The second delay adjust circuit 610(N) is configured to generate a second delay adjust signal DEL_ADJ(N) based on the second delay control signal DEL_CTL(N). In this alternative embodiment, the second delay adjust signal DEL_ADJ(N) is the delay adjust signal DEL_ADJ(N) in the clock calibration circuit 204 in the another one of the plurality of calibrated SAR-ADC circuits 602(N).

In some embodiments, the delay control modification circuit 608(0) further includes a first control signal generation circuit 506(0) corresponding to the control signal generation circuit 506 in FIG. 5. The delay control modification circuit 608(0) further includes storage circuit 504(0) corresponding to the storage circuit 504 in FIG. 5. The delay control modification circuit 608(0) also includes an override input configured to receive an override signal OVERRIDE(0). The control signal generation circuit 506(0) is configured to generate the delay control signal DEL_CTL(0) to control the phase difference between the phase of the monitored delayed clock signal CLOCK$_{MON}$(0) of one of the plurality of calibrated SAR-ADC circuits 602(0) and the second phase of the phase-shifted clock signal CLOCK$_{PS}$(0) based on at least one of the override signal OVERRIDE(0), a stored value of the override signal OVERRIDE(0) stored in the storage circuit 504(0), and the indication PHASE_DIFF(0) of the phase difference from the phase-difference detection circuit 606 for the one of the plurality of calibrated SAR-ADC circuits 602(0). In the alternative embodiment, the second delay control modification circuit 608(N) includes a second control signal generation circuit 506(N) (not shown) configured to generate the second delay control signal DEL_CTL(N) to control the second phase difference between the phase of the monitored delayed clock signal CLOCK$_{MON}$(0) of another one of the plurality of calibrated SAR-ADC circuits 602(N) and the second phase of the phase-shifted clock signal CLOCK$_{PS}$(0) based on at least one of a second override signal OVERRIDE(N), a stored value of the second override signal OVERRIDE(N) stored in a second storage circuit 504(N), and the second indication PHASE_DIFF(N) of the second phase difference from a second one of the phase-difference detection circuits 606(N) for the another one of the plurality of calibrated SAR-ADC circuits 602(N).

FIG. 7 is a flowchart illustrating a method 700 of the time-interleaved SAR-ADC system 600 in FIG. 6 employing time-interleaved calibrated SAR-ADC circuits 602(0)-602(M−1) for converting voltage levels in consecutive cycles of an analog data signal V$_{IN}$ to serial digital data. The method 700 includes, in each of a plurality of calibrated SAR-ADC circuits 602(0)-602(M−1) (block 702), receiving one of a plurality of first clock signals CLOCK$_{1ST}$(0)-CLOCK$_{1ST}$(M−1) each having a frequency and a respective phase (block 704), generating, in a clock calibration circuit 204, a plurality of delayed clock signals DCLK(0)-DCLK(N) each delayed with respect to the one of the plurality of first clock signals CLOCK$_{1ST}$(0)-CLOCK$_{1ST}$(M−1) based on a delay adjust signal DEL_ADJ(N) (block 706). The method 700 also includes sampling, in a calibrated SAR-ADC circuit 602(0)-602(M−1), a voltage level of an analog data signal V$_{IN}$ in response to a calibrated delayed clock signal CLOCK$_{CAL}$ among the plurality of delayed clock signals DCLK(0)-DCLK(N) (block 708), and generating, in the calibrated SAR-ADC circuit 602(0)-602(M−1), a digital value V$_{OUT}$ corresponding to the sampled voltage level V$_{DATA}$ of the analog data signal V$_{IN}$ (block 710).

The method 700 continues in a delay control circuit 604(0) (block 712) with receiving a monitored delayed clock signal CLOCK$_{MON}$(0) among the plurality of delayed clock signals DCLK(0)-DCLK(N) from one of the plurality of calibrated SAR-ADC circuits 602(0)-602(M−1) (block 714), and receiving a phase-shifted clock signal CLOCK$_{PS}$(0) having a same frequency and a second phase different than the first phase of the first clock signal CLOCK$_{1ST}$(0)-CLOCK$_{1ST}$(M−1) received in the one of the plurality of calibrated SAR-ADC circuits 602(0)-602(M−1) (block 716). The method 700 also includes generating, in a phase-difference detection circuit 606(0), an indication PHASE_DIFF(0) of a phase difference between a phase of the monitored delayed clock signal CLOCK$_{MON}$(0) and the second phase of the phase-shifted clock signal CLOCK$_{PS}$(0) (block 718), and generating, in a delay control modification circuit 608(0), a delay control signal DEL_CTL(0) based on the indication PHASE_DIFF(0) of the phase difference (block 720). The method further includes generating a first delay adjust signal DEL_ADJ(0) based on the delay control signal DEL_CTL(0) (block 722). In the method 700, the delay control signal DEL_CTL(0) is provided as the first delay adjust signal DEL_ADJ(0) to at least one of the plurality of calibrated SAR-ADC circuits 602(0)-602(M−1).

FIG. 8 is a block diagram of an exemplary processor-based system 800 that includes a processor 802 (e.g., a microprocessor) that includes an instruction processing circuit 804. The processor-based system 800 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 800 includes the processor 802. The processor 802 represents one or more general-purpose processing circuits, such as a microprocessor, central processing unit, or the like. The processor 802 is configured to execute processing logic in instructions for performing the operations and steps discussed herein.

The processor 802 can include a register rename recover circuit 814 to recover a state of a register rename map table in the instruction processing circuit 804 in response to a flush indication indicating a flush of some instruction in an instruction pipeline due to a failed instruction.

The processor 802 and main memory 810 are coupled to a system bus 812 and can intercouple peripheral devices included in the processor-based system 800. As is well known, the processor 802 communicates with these other devices by exchanging address, control, and data information over the system bus 812. For example, the processor 802 can communicate bus transaction requests to a memory controller 819 in the main memory 810 as an example of a slave device. Although not illustrated in FIG. 8, multiple system buses 812 could be provided, wherein each system bus constitutes a different fabric. In this example, the memory controller 819 is configured to provide memory access requests to a memory array 820 in the main memory 810. The memory array 820 is comprised of an array of storage bit cells for storing data. The main memory 810 may be a read-only memory (ROM), flash memory, dynamic random access memory (DRAM), such as synchronous DRAM (SDRAM), etc., and a static memory (e.g., flash memory, static random access memory (SRAM), etc.), as non-limiting examples.

Other devices can be connected to the system bus 812. As illustrated in FIG. 8, these devices can include the main memory 810, one or more input devices 822, one or more output devices 824, a modem 826, and one or more display controllers 828, as examples. The input device(s) 822 can include any type of input device, including, but not limited to, input keys, switches, voice processors, etc. The input device(s) 822 can include the time-interleaved SAR-ADC system 600 of FIG. 6 or the calibrated SAR-ADC circuit 200 of FIG. 2 for receiving serial data in an analog data signal over a high-speed data interface. The output device 824 can include any type of output device, including but not limited to audio, video, other visual indicators, etc. The modem 826 can be any device configured to allow exchange of data to and from a network 830. The network 830 can be any type of network, including but not limited to a wired or wireless network, a private or public network, a local area network (LAN), a wireless local area network (WLAN), a wide area network (WAN), a BLUETOOTH™ network, and the Internet. The modem 826 can be configured to support any type of communications protocol desired. The processor 802 may also be configured to access the display controller 828 over the system bus 812 to control information sent to one or more displays 832. The display(s) 832 can include any type of display, including but not limited to a cathode ray tube (CRT), a liquid crystal display (LCD), a plasma display, etc.

The processor-based system 800 in FIG. 8 may include a set of instructions 834 to be executed by the processor 802 for any application desired according to the instructions. The instructions 834 may be stored in the main memory 810, processor 802, and/or instruction cache 808 as examples of a non-transitory computer-readable medium 836. The instructions 834 may also reside, completely or at least partially, within the main memory 810 and/or within the processor 802 during their execution. The instructions 834 may further be transmitted or received over the network 830 via the modem 826, such that the network 830 includes computer-readable medium 836.

While the computer-readable medium 836 is shown in an exemplary embodiment to be a single medium, the term "computer-readable medium" should be taken to include a single medium or multiple media (e.g., a centralized or distributed database, and/or associated caches and servers) that stores the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product, or software, that may include a machine-readable medium (or computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes: a machine-readable storage medium (e.g., ROM, random access memory ("RAM"), a magnetic disk storage medium, an optical storage medium, flash memory devices, etc.); and the like.

Unless specifically stated otherwise and as apparent from the previous discussion, it is appreciated that throughout the description, discussions utilizing terms such as "processing," "computing," "determining," "displaying," or the like, refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the distributed antenna systems described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware, and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips, that may be references throughout the above description, may be represented by voltages, currents, electromagnetic waves, magnetic fields, or particles, optical fields or particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A calibrated sequential approximation register (SAR) analog-to-digital converter (ADC) (SAR-ADC) circuit, comprising:
 a clock calibration circuit, comprising:
  a clock input configured to receive a first clock signal having a first phase and a frequency; and
  a variable delay clock circuit configured to generate a plurality of delayed clock signals each delayed by a respective delay with respect to the first clock signal based on a delay adjust signal;
 a SAR-ADC circuit configured to:
  sample a voltage level of an analog data signal in response to a calibrated delayed clock signal of the plurality of delayed clock signals; and
  generate a digital value corresponding to the sampled voltage level of the analog data signal; and a delay control circuit, comprising:
- a phase-difference detection circuit, configured to:
  - receive a monitored delayed clock signal of the plurality of delayed clock signals delayed by a selected delay with respect to the first clock signal;
  - receive a phase-shifted clock signal having the frequency of the first clock signal and a second phase different than the first phase of the first clock signal; and
  - generate an indication of a phase difference between a phase of the monitored delayed clock signal and the second phase of the phase-shifted clock signal; and
- a delay adjust circuit configured generate the delay adjust signal based on the indication of the phase difference from the phase-difference detection circuit.

2. The calibrated SAR-ADC circuit of claim 1, wherein: the delay control circuit is configured to generate the delay adjust signal to control the phase difference between the phase of the monitored delayed clock signal and the second phase of the phase-shifted clock signal.

3. The calibrated SAR-ADC circuit of claim 1, wherein: the delay control circuit is configured generate the delay adjust signal to offset a change to the phase difference to minimize the phase difference between the phase of the monitored delayed clock signal and the second phase of the phase-shifted clock signal.

4. The calibrated SAR-ADC circuit of claim 1, wherein: the second phase of the phase-shifted clock signal lags the first phase of the first clock signal; and
the delay control circuit is configured to:
- in response to the indication of the phase difference indicating that the phase of the monitored delayed clock signal leads the second phase of the phase-shifted clock signal, adjust a delay control signal to increase a delay of the monitored delayed clock signal with respect to the phase-shifted clock signal; and
- in response to the indication of the phase difference indicating that the phase of the monitored delayed clock signal lags the second phase of the phase-shifted clock signal, adjust the delay control signal to decrease the delay of the monitored delayed clock signal with respect to the phase-shifted clock signal.

5. The calibrated SAR-ADC circuit of claim 1, wherein the delay control circuit further comprises:
- a delay control modification circuit configured to:
  - receive the indication of the phase difference from the phase-difference detection circuit; and
  - generate a delay control signal to control the delay adjust circuit to set the phase difference between the phase of the monitored delayed clock signal and the second phase of the phase-shifted clock signal based on an override signal.

6. The calibrated SAR-ADC circuit of claim 5, wherein: the delay control modification circuit comprises a control signal generation circuit configured to generate the override signal based on at least one of:
- the override signal received on an override input;
- a storage circuit configured to store a value of the override signal; and
- the indication of the phase difference from the phase-difference detection circuit.

7. The calibrated SAR-ADC circuit of claim 1, wherein: the variable delay clock circuit comprises:
- serially coupled delay buffers configured to delay the first clock signal; and
- a plurality of tap outputs coupled to outputs of the respective delay buffers; and
- a multiplexor circuit coupled to the plurality of tap outputs of the variable delay clock circuit is configured to:
  - receive a selectable plurality of delayed clock signals among the plurality of delayed clock signals;
  - select, based on a selection signal, one of the selectable plurality of delayed clock signals; and
  - generate the calibrated delayed clock signal based on the selected one of the selectable plurality of delayed clock signals.

8. A method in a calibrated sequential approximation register (SAR) analog-to-digital converter (ADC) (SAR-ADC) circuit, comprising:
- in a clock calibration circuit:
  - receiving a first clock signal having a frequency and a first phase; and
  - generating a plurality of delayed clock signals each delayed by a respective delay with respect to the first clock signal based on a delay adjust signal;
- in a SAR-ADC circuit:
  - sampling a voltage level on an analog data signal in response to a calibrated delayed clock signal of the plurality of delayed clock signals; and
  - generating a digital value corresponding to the sampled voltage level; and
- in a delay control circuit:
  - receiving a monitored delayed clock signal of the plurality of delayed clock signals delayed by a selected delay with respect to the first clock signal;
  - receiving a phase-shifted clock signal having the frequency of the first clock signal and a second phase different than the first phase of the first clock signal;
  - generating an indication of a phase difference between a phase of the monitored delayed clock signal and the second phase of the phase-shifted clock signal; and
  - generating the delay adjust signal based on the indication of the phase difference.

9. The method of claim 8, further comprising:
generating the delay adjust signal to control the phase difference between the phase of the monitored delayed clock signal and the second phase of the phase-shifted clock signal.

10. The method of claim 8, further comprising:
generating the delay adjust signal to offset a change to the phase difference to minimize the phase difference between the phase of the monitored delayed clock signal and the second phase of the phase-shifted clock signal.

11. The method of claim 8, wherein:
the second phase of the phase-shifted clock signal lags the first phase of the first clock signal; and
generating the delay adjust signal further comprises:
- in response to the indication of the phase difference indicating that the phase of the monitored delayed clock signal leads the second phase of the phase-shifted clock signal, adjusting a delay control signal to increase a delay of the monitored delayed clock signal with respect to the phase-shifted clock signal; and
- in response to the indication of the phase difference indicating that the phase of the monitored delayed clock signal lags the second phase of the phase-shifted clock signal, adjusting the delay control signal to decrease the delay of the monitored delayed clock signal with respect to the phase-shifted clock signal.

12. The method of claim 8, further comprising:
receiving the indication of the phase difference from a phase-difference detection circuit; and
generating a delay control signal to set the phase difference between the phase of the monitored delayed clock signal and the second phase of the phase-shifted clock signal based on an override signal.

13. The method of claim 12, further comprising generating the override signal based on at least one of:
the override signal received on an override input;
a storage circuit configured to store a value of the override signal; and
the indication of the phase difference from the phase-difference detection circuit.

14. The method of claim 8, further comprising:
delaying the first clock signal in serially coupled delay buffers;
receiving a selectable plurality of delayed clock signals of the plurality of delayed clock signals from respective outputs of the serially coupled delay buffers;
selecting, based on a selection signal, one of the selectable plurality of delayed clock signals; and
generating the calibrated delayed clock signal based on the selected one of the selectable plurality of delayed clock signals.

15. A time-interleaved sequential approximation register (SAR) analog-to-digital converter (ADC) (SAR-ADC) system comprising:
a plurality of clock inputs configured to receive a plurality of first clock signals each having a frequency and a respective phase;
a plurality of calibrated SAR-ADC circuits, each comprising:
a clock calibration circuit, configured to:
generate a plurality of delayed clock signals each delayed with respect to a first one of the plurality of first clock signals based on a delay adjust signal; and
a SAR-ADC circuit configured to:
sample a voltage level of an analog data signal in response to a calibrated delayed clock signal among the plurality of delayed clock signals; and
generate a digital value corresponding to the sampled voltage level of the analog data signal; and
a delay control circuit comprising:
a phase-difference detection circuit configured to:
receive a monitored delayed clock signal among the plurality of delayed clock signals from one of the plurality of calibrated SAR-ADC circuits;
receive a phase-shifted clock signal having a same frequency and a second phase different than a first phase of a first clock signal received in the one of the plurality of calibrated SAR-ADC circuits; and
generate an indication of a phase difference between a phase of the monitored delayed clock signal and the second phase of the phase-shifted clock signal;
a delay control modification circuit configured generate a delay control signal based on the indication of the phase difference from the phase-difference detection circuit; and
a delay adjust circuit configured to generate a first delay adjust signal based on the delay control signal; and wherein:
the first delay adjust signal is the delay adjust signal in the clock calibration circuit in at least one of the plurality of calibrated SAR-ADC circuits.

16. The time-interleaved SAR-ADC system of claim 15, wherein:
the delay control circuit is configured to generate the first delay adjust signal to control the phase difference between the phase of the monitored delayed clock signal and the second phase of the phase-shifted clock signal in the at least one of the plurality of calibrated SAR-ADC circuits.

17. The time-interleaved SAR-ADC system of claim 15, wherein the delay control modification circuit comprises:
a control signal generation circuit configured to generate the delay control signal based on at least one of:
a first override signal received on an override input;
a stored value of the first override signal stored in a storage circuit; and
the indication of the phase difference from the phase-difference detection circuit.

18. The time-interleaved SAR-ADC system of claim 17, further comprising a second delay control circuit, comprising:
a second phase-difference detection circuit configured to generate a second indication of a second phase difference between the phase of the monitored delayed clock signal of another one of the plurality of calibrated SAR-ADC circuits, not among the at least one of the plurality of calibrated SAR-ADC circuits, and the second phase of a second phase-shifted clock signal;
a second delay control modification circuit configured to generate a second delay control signal based on the second indication of the second phase difference from the second phase-difference detection circuit; and
a second delay adjust circuit configured to generate a second delay adjust signal based on the second delay control signal;
wherein the second delay adjust signal is the delay adjust signal in the clock calibration circuit in the another one of the plurality of calibrated SAR-ADC circuits.

19. A method in a time-interleaved sequential approximation register (SAR) analog-to-digital converter (ADC) (SAR-ADC) system, comprising:
in each of a plurality of calibrated SAR-ADC circuits:
receiving one of a plurality of first clock signals each having a frequency and a respective first phase;
generating, in a clock calibration circuit, a plurality of delayed clock signals each delayed with respect to the one of the plurality of first clock signals based on a delay adjust signal;
sampling, in a SAR-ADC circuit, a voltage level of an analog data signal in response to a calibrated delayed clock signal among the plurality of delayed clock signals; and
generating, in the SAR-ADC circuit, a digital value corresponding to the sampled voltage level of the analog data signal; and
in a delay control circuit:
receiving a monitored delayed clock signal among the plurality of delayed clock signals from one of the plurality of calibrated SAR-ADC circuits;
receiving a phase-shifted clock signal having a same frequency and a second phase different than the respective first phase of the one of the plurality of first clock signals received in the one of the plurality of calibrated SAR-ADC circuits;

generating, in a phase-difference detection circuit, an indication of a phase difference between a phase of the monitored delayed clock signal and the second phase of a phase-shifted clock signal;

generating, in a delay control modification circuit, a delay control signal based on the indication of the phase difference; and generating a first delay adjust signal based on the delay control signal;

wherein:

the first delay adjust signal is the delay adjust signal in at least one of the plurality of calibrated SAR-ADC circuits.

20. The method of claim 19, further comprising:

generating the first delay adjust signal to control the phase difference between the phase of the monitored delayed clock signal in the at least one of the plurality of calibrated SAR-ADC circuits and the second phase of the phase-shifted clock signal.

21. The method of claim 19, further comprising:

generating, in a first control signal generation circuit in the delay control modification circuit, the delay control signal based on at least one of:

a first override signal received on an override input;

a stored value of the first override signal stored in a storage circuit; and the indication of the phase difference from the phase-difference detection circuit.

22. The method of claim 21, further comprising:

generating, in a second phase-difference detection circuit, a second indication of a second phase difference between the phase of the monitored delayed clock signal of another one of the plurality of calibrated SAR-ADC circuits, not among the at least one of the plurality of calibrated SAR-ADC circuits, and the second phase of a second phase-shifted clock signal;

generating, in a second delay control modification circuit, a second delay control signal; and generating, in a second delay adjust circuit, a second delay adjust signal based on the second delay control signal;

wherein the second delay adjust signal is the delay adjust signal in the another one of the plurality of calibrated SAR-ADC circuits.

* * * * *